(12) United States Patent
Tabuchi et al.

(10) Patent No.: US 11,619,669 B2
(45) Date of Patent: Apr. 4, 2023

(54) CONDITION MONITORING SYSTEM, CONDITION MONITORING METHOD, CONDITION MONITORING PROGRAM, AND STORAGE MEDIUM

(71) Applicant: PANASONIC INTELLECTUAL PROPERTY MANAGEMENT CO., LTD., Osaka (JP)

(72) Inventors: Shin Tabuchi, Kyoto (JP); Satoshi Kanai, Osaka (JP); Hiromichi Nishiyama, Osaka (JP)

(73) Assignee: PANASONIC IN IELLECTUAL PROPERTY MANAGEMENT CO., LTD., Osaka (JP)

( * ) Notice: Subject to any disclaimer, the term of this patent is extended or adjusted under 35 U.S.C. 154(b) by 726 days.

(21) Appl. No.: 16/480,285

(22) PCT Filed: Jan. 25, 2018

(86) PCT No.: PCT/JP2018/002189
§ 371 (c)(1),
(2) Date: Jul. 23, 2019

(87) PCT Pub. No.: WO2018/139505
PCT Pub. Date: Aug. 2, 2018

(65) Prior Publication Data
US 2020/0033411 A1     Jan. 30, 2020

(30) Foreign Application Priority Data
Jan. 25, 2017 (JP) .............................. JP2017-011413

(51) Int. Cl.
*F03D 9/12*     (2016.01)
*F03D 17/00*    (2016.01)
(Continued)

(52) U.S. Cl.
CPC ............. *G01R 31/343* (2013.01); *F03D 9/12* (2016.05); *F03D 17/00* (2016.05); *F03D 80/82* (2016.05); *G01R 31/72* (2020.01)

(58) Field of Classification Search
CPC ....... G01R 31/72; G01R 31/343; F03D 17/00; F03D 9/12; F03D 80/82
See application file for complete search history.

(56) References Cited

U.S. PATENT DOCUMENTS

2011/0313701 A1   12/2011  Higgins
2015/0260794 A1*   9/2015  Athikessavan ...... G01R 31/343
                                                        702/58
(Continued)

FOREIGN PATENT DOCUMENTS

CN    105221353 A    1/2016
JP    H05-196702 A   8/1993
(Continued)

OTHER PUBLICATIONS

Notification of First Office Action dated Apr. 27, 2021, issued in corresponding Chinese Patent Application No. 201880008562.7; with English translation.
International Search Report and Written Opinion issued in International Patent Application No. PCT/JP2018/002189, dated Feb. 27, 2018; with English translation.

*Primary Examiner* — Natalie Huls
*Assistant Examiner* — Sharad Timilsina
(74) *Attorney, Agent, or Firm* — McDermott Will & Emery LLP

(57) ABSTRACT

The condition monitoring system includes an acquisition unit and a generation unit. The acquisition unit acquires waveform data from a measuring device to measure an electrical signal that is either output or input of a converter. The waveform data represents a waveform of the electrical signal. The generation unit generates, based on the wave-
(Continued)

form data, analysis data to monitor the condition concerning the converter. The generation unit obtains, by frequency analysis, a plurality of combinations, each including a value of a frequency and a value of a feature quantity that is either intensity or phase, based on the waveform data when a value of the drive frequency varies and thereby generate the analysis data having at least three variables including the frequency, the feature quantity, and the drive frequency.

10 Claims, 11 Drawing Sheets

(51) Int. Cl.
*G01R 31/72* (2020.01)
*G01R 31/34* (2020.01)
*F03D 80/80* (2016.01)

(56) References Cited

U.S. PATENT DOCUMENTS

2015/0308285 A1* 10/2015 Falb .................... F03D 9/25
                                                              73/112.01
2016/0215764 A1    7/2016 Sakaguchi

FOREIGN PATENT DOCUMENTS

| JP | H11-83686 A    | 3/1999 |
| JP | 2012-513024 A  | 6/2012 |
| JP | 2015-004694 A  | 1/2015 |
| JP | 2015-072006 A  | 4/2015 |
| JP | 2017-14966 A   | 1/2017 |

* cited by examiner

CONDITION MONITORING SYSTEM, CONDITION MONITORING METHOD, CONDITION MONITORING PROGRAM, AND STORAGE MEDIUM

CROSS-REFERENCE OF RELATED APPLICATIONS

This application is the U.S. National Phase under 35 U.S.C. § 371 of International Patent Application No. PCT/JP2018/002189, filed on Jan. 25, 2018, which in turn claims the benefit of Japanese Application No. 2017-011413, filed on Jan. 25, 2017, the entire disclosures of which Applications are incorporated by reference herein.

TECHNICAL FIELD

The present disclosure generally relates to a condition monitoring system, a condition monitoring method, a condition monitoring program, and a storage medium. More particularly, the present disclosure relates to a condition monitoring system, a condition monitoring method, a condition monitoring program, and a storage medium, all of which are configured or designed to monitor the condition of a converter for converting the energy of a mover, which performs a periodic motion at a variable drive frequency, unidirectionally from kinetic energy to electric energy or from electric energy to kinetic energy, or bidirectionally between kinetic energy and electric energy.

BACKGROUND ART

A condition monitoring system has been proposed in the art as a system for detecting any fault with a power generation facility such as a wind turbine by using a vibration sensor. Such a wind turbine condition monitoring device is disclosed in, for example, Patent Literature 1. The wind turbine of Patent Literature 1 includes a nacelle disposed at the top of its tower, and a rotator (rotor head) to which blades are attached. A main shaft introduced into the nacelle is connected to the rotator. The main shaft is coupled to an input shaft of a speed up gear, of which the output shaft is connected to a power generator.

The condition monitoring system of Patent Literature 1 includes a vibration sensor for detecting the mechanical vibrations of a bearing for the main shaft and another vibration sensor for detecting the mechanical vibrations produced in the wind turbine. Using the outputs of these vibration sensors, this condition monitoring system monitors the condition of the wind turbine to detect any fault with the bearing or any decline in the mechanical strength (rigidity) of the tower. Each of these vibration sensors is implemented as an acceleration sensor including a piezoelectric element, for example. To detect the mechanical vibrations produced in the wind turbine, these vibration sensors are provided near a region where the vibrations are produced, i.e., inside or near the nacelle.

In known condition monitoring systems like this, the vibration sensors need to be located near the region where the vibrations are produced. Therefore, in the case of a wind turbine, for example, the vibration sensors need to be installed at a normally inaccessible elevated place such as inside the nacelle, thus requiring a lot of trouble in installing the vibration sensors. This presents an obstacle to installation of the condition monitoring systems.

CITATION LIST

Patent Literature

Patent Literature 1: JP 2015-72006 A

SUMMARY OF INVENTION

In view of the foregoing background, it is therefore an object of the present disclosure to provide an easily introducible condition monitoring system, condition monitoring method, condition monitoring program, and storage medium.

A condition monitoring system according to a first aspect is a system for monitoring a condition concerning a converter to convert energy of a mover unidirectionally from kinetic energy to electric energy or from electric energy to kinetic energy, or bidirectionally between kinetic energy and electric energy. The mover performs a periodic motion at a variable drive frequency. The condition monitoring system includes an acquisition unit and a generation unit. The acquisition unit acquires waveform data from a measuring device to measure an electrical signal that is either output or input of the converter. The waveform data represents a waveform of the electrical signal. The generation unit generates, based on the waveform data, analysis data to monitor the condition concerning the converter. The generation unit obtains, by frequency analysis, a plurality of combinations, each including a value of a frequency and a value of a feature quantity that is either intensity or phase, based on the waveform data when a value of the drive frequency varies and thereby generate the analysis data having at least three variables including the frequency, the feature quantity, and the drive frequency.

In a condition monitoring system according to a second aspect, which may be implemented in conjunction with the first aspect, the generation unit is configured to perform sort processing for rearranging the analysis data according to the drive frequency.

In a condition monitoring system according to a third aspect, which may be implemented in conjunction with the first or second aspect, the analysis data is configured to display an image in which a plurality of pixels, of which pixel values each represent the feature quantity, are arranged two-dimensionally along axes of the frequency and the drive frequency.

A condition monitoring system according to a fourth aspect is a system for monitoring a condition concerning a converter to convert energy of a mover unidirectionally from kinetic energy to electric energy or from electric energy to kinetic energy, or bidirectionally between kinetic energy and electric energy. The mover performs a periodic motion at a variable drive frequency. The condition monitoring system includes a diagnosis unit. The diagnosis unit diagnoses the condition concerning the converter based on analysis data to be generated from waveform data representing a waveform of an electrical signal that is either output or input of the converter. The analysis data is generated by obtaining, by frequency analysis, a plurality of combinations, each including a value of a frequency and a value of a feature quantity that is either intensity or phase, based on the waveform data when a value of the drive frequency varies. The analysis data has at least three variables including the frequency, the feature quantity, and the drive frequency.

In a condition monitoring system according to a fifth aspect, which may be implemented in conjunction with the fourth aspect, the diagnosis unit diagnoses the condition concerning the converter based on a value of the feature quantity, corresponding to a value of a particular frequency among multiple values of the frequency, by reference to the analysis data.

In a condition monitoring system according to a sixth aspect, which may be implemented in conjunction with the fifth aspect, the diagnosis unit determines a coefficient n when a value of the feature quantity, corresponding to multiple combinations, satisfies a predetermined condition, and thereby determine the particular frequency based on the value of the coefficient n thus determined. Each of the multiple combinations includes a value of the drive frequency and a value of the frequency that are given by a predetermined relational using at least the drive frequency fx, the frequency fy, and the coefficient n.

In a condition monitoring system according to a seventh aspect, which may be implemented in conjunction with the sixth aspect, the predetermined relational expression, further using a reference frequency fs1 of the electrical signal, is fy=fs1+n×fx.

In a condition monitoring system according to an eighth aspect, which may be implemented in conjunction with any one of the first to seventh aspects, the mover is configured to perform a rotary motion at the drive frequency.

In a condition monitoring system according to a ninth aspect, which may be implemented in conjunction with the eighth aspect, the mover includes a field winding, and the condition monitoring system further includes an estimation unit to obtain the value of the drive frequency using at least output of the field winding.

In a condition monitoring system according to a tenth aspect, which may be implemented in conjunction with any one of the first to ninth aspects, the converter constitutes a power generation facility.

A condition monitoring method according to an eleventh aspect is a method for monitoring a condition concerning a converter to convert energy of a mover unidirectionally from kinetic energy to electric energy or from electric energy to kinetic energy, or bidirectionally between kinetic energy and electric energy. The mover performs a periodic motion at a variable drive frequency. The condition monitoring method includes acquisition processing and generation processing. The acquisition processing includes acquiring waveform data from a measuring device to measure an electrical signal that is either output or input of the converter. The waveform data represents a waveform of the electrical signal. The generation processing includes generating, based on the waveform data, analysis data to monitor the condition concerning the converter. The generation processing includes obtaining, by frequency analysis, a plurality of combinations, each including a value of a frequency and a value of a feature quantity that is either intensity or phase, based on the waveform data when a value of the drive frequency varies and thereby generating the analysis data having at least three variables including the frequency, the feature quantity, and the drive frequency.

A condition monitoring method according to a twelfth aspect is a method for monitoring a condition concerning a converter to convert energy of a mover unidirectionally from kinetic energy to electric energy or from electric energy to kinetic energy, or bidirectionally between kinetic energy and electric energy. The mover performs a periodic motion at a variable drive frequency. The condition monitoring method includes diagnosis processing. The diagnosis processing includes diagnosing the condition concerning the converter based on analysis data to be generated from waveform data representing a waveform of an electrical signal that is either output or input of the converter. The analysis data is generated by obtaining, by frequency analysis, a plurality of combinations, each including a value of a frequency and a value of a feature quantity that is either intensity or phase, based on the waveform data when a value of the drive frequency varies. The analysis data has at least three variables including the frequency, the feature quantity, and the drive frequency.

A condition monitoring program according to a thirteenth aspect is a program for monitoring a condition concerning a converter to convert energy of a mover unidirectionally from kinetic energy to electric energy or from electric energy to kinetic energy, or bidirectionally between kinetic energy and electric energy. The mover performs a periodic motion at a variable drive frequency. The condition monitoring program makes a computer system execute acquisition processing and generation processing. The acquisition processing includes acquiring waveform data from a measuring device to measure an electrical signal that is either output or input of the converter. The waveform data represents a waveform of the electrical signal. The generation processing includes generating, based on the waveform data, analysis data to monitor the condition concerning the converter. The generation processing includes obtaining, by frequency analysis, a plurality of combinations, each including a value of a frequency and a value of a feature quantity that is either intensity or phase, based on the waveform data when a value of the drive frequency varies and thereby generating the analysis data having at least three variables including the frequency, the feature quantity, and the drive frequency.

A condition monitoring program according to a fourteenth aspect is a program for monitoring a condition concerning a converter to convert energy of a mover unidirectionally from kinetic energy to electric energy or from electric energy to kinetic energy, or bidirectionally between kinetic energy and electric energy. The mover performs a periodic motion at a variable drive frequency. The condition monitoring program makes a computer system execute diagnosis processing. The diagnosis processing includes diagnosing the condition concerning the converter based on analysis data to be generated from waveform data representing a waveform of an electrical signal that is either output or input of the converter. The analysis data is generated by obtaining, by frequency analysis, a plurality of combinations, each including a value of a frequency and a value of a feature quantity that is either intensity or phase, based on the waveform data when a value of the drive frequency varies. The analysis data has at least three variables including the frequency, the feature quantity, and the drive frequency.

A storage medium according to a fifteenth aspect stores the analysis data generated by the condition monitoring method according to the eleventh aspect.

DESCRIPTION OF EMBODIMENTS

First Embodiment (1) Overview

Figure 1:
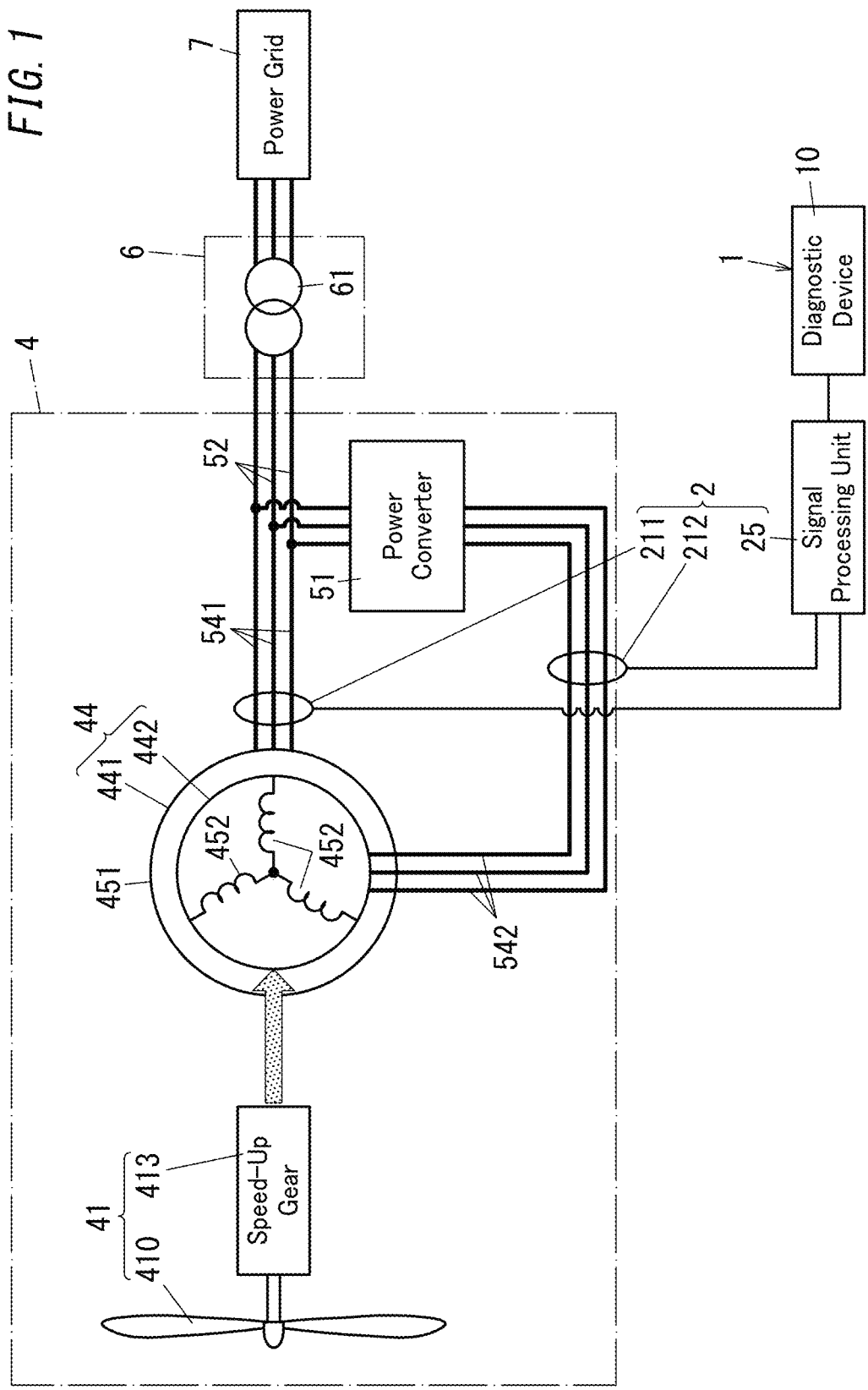
FIG. 1 is a block diagram illustrating a basic configuration for a condition monitoring system according to a first embodiment.

A condition monitoring system 1 according to an exemplary embodiment is used to monitor the condition concerning a converter 4 to convert the energy of a mover 442 unidirectionally from kinetic energy to electric energy or from electric energy to kinetic energy, or bidirectionally from kinetic energy (mechanical energy) to electric energy, and/or vice versa, as shown in FIG. 1. The mover 442 performs a periodic motion at a drive frequency. As used herein, the "periodic motion" refers to motion to be repeated at generally regular time intervals and includes at least both rotation and vibration. Also, as used herein, the "condition concerning the converter 4" refers to whether or not the converter 4 has any faults, the operating (running) state of the converter 4, and the life of the converter 4, for example. Furthermore, the "condition concerning the converter 4" includes not only the condition of the converter 4 itself, but also the conditions of mechanical parts coupled mechanically to the converter 4 and other devices and equipment associated with the converter 4.

Examples of this type of converters 4 include wind power generation facilities (also called "wind turbine facilities") for turning windmills with the force of wind, hydroelectric power generation facilities for turning a water power mill with the force of water, fire power generation facilities for turning a turbine with steam or combustion gas, and nuclear power generation facilities. Other than these, geothermal power generation facilities, pumping power generation facilities, and wave power generation facilities are also counted among them. The converter 4 does not have to be a power generation facility for generating power by a rotary motion of the mover 442 but may also be a power generation facility for generating power by vibration of the mover 442 as well.

Also, the converter 4 only needs to have the capability of converting the energy of the mover 442 unidirectionally from kinetic energy to electric energy or from electric energy to kinetic energy, or bidirectionally between kinetic energy and electric energy, and does not have to be a power generation facility for converting the kinetic energy of the mover 442 to electric energy. Alternatively, the converter 4 may also be an electric motor (motor) or any other device for converting electric energy to the kinetic energy of the mover 442, for example. Specifically, when supplied with electric energy, an electric motor or any other rotation device converts the electric energy to the kinetic energy of the mover 442, thus causing the mover 442 to perform a periodic motion. Furthermore, the converter 4 may also be configured to convert the energy of the mover 442 bidirectionally between kinetic energy and electric energy.

When the converter 4 is implemented as a power generation facility, a periodic motion of the mover 442 allows the converter 4 to output an electrical signal (which may be an AC voltage signal or an AC current signal, for example). On the other hand, when the converter 4 is implemented as an electric motor, input of an electrical signal (such as a drive current) to the converter 4 allows the mover 442 to perform a periodic motion.

In the exemplary embodiment to be described below, the converter 4 to be monitored by the condition monitoring system 1 is a power generation facility as an example. In addition, in the following description, the converter 4 includes a mover 442 configured to perform a rotary motion at a drive frequency as an example. Specifically, in the exemplary embodiment to be described below, the converter 4 is implemented as a wind turbine facility such as the one shown in FIG. 1.

The converter 4 of this type includes a movable block 41 that supplies motive power to the mover 442 in order to generate electric energy by turning the mover 442. That is to say, the mover 442 is a rotor configured to perform a rotary motion at a variable drive frequency. As used herein, the movable block 41 includes a rotator 410 (which may be a windmill in the case of a wind turbine facility) and members contributing to the rotation of the rotator 410 or the mover 442 (such as a shaft, a bearing, and a speed up gear 413). In the converter 4 of this type, some fault may be caused in the movable block 41 due to deterioration with time of at least one part of the movable block 41, for example. As used herein, the "fault with the movable block 41" refers to every type of fault that the movable block 41 could have, and includes not only fault (such as deformation or damage) with the rotator 410 itself but also fault with the main shaft 411 (see FIG. 2), the bearing 412 (see FIG. 2), or the speed-up gear 413 (see FIG. 2) as well. A specific exemplary fault with the movable block 41 will be described later in the "(2.2) Fault with movable block" section. If the converter 4 continues to operate with any fault caused in the movable block 41, then damage could spread to the point of dong serious damage to the converter 4.

Thus, to overcome such a problem, the condition monitoring system 1 according to this embodiment enables early detection of any fault with the movable block 41 of the converter 4 by diagnosing, as a condition concerning the converter 4, whether or not the movable block 41 has any fault. Therefore, if the diagnosis made by the condition monitoring system 1 indicates that there should be some fault with the movable block 41, then the user may take some proactive measures such as maintenance (including checkup and repair) of the converter 4 before serious damage is done to the converter 4. That is to say, monitoring the converter 4 with this condition monitoring system 1 reduces the chances of the damage spreading by having the user detect any symptom of damage that could be done to the converter 4 and take appropriate precautions before serious damage is done to the converter 4. As used herein, the "user"

refers to a business proprietor who runs or manages the converter 4, and may sometimes be an organization such as a business enterprise and sometimes be a sole proprietor.

(2) Details

Next, a condition monitoring system 1 according to this embodiment will be described in detail.

(2.1) Converter

First of all, the converter 4 to be monitored by the condition monitoring system 1 according to this embodiment will be described. In the following description of this embodiment, the converter 4 is a wind turbine facility as an example, as described above.

Figure 2:
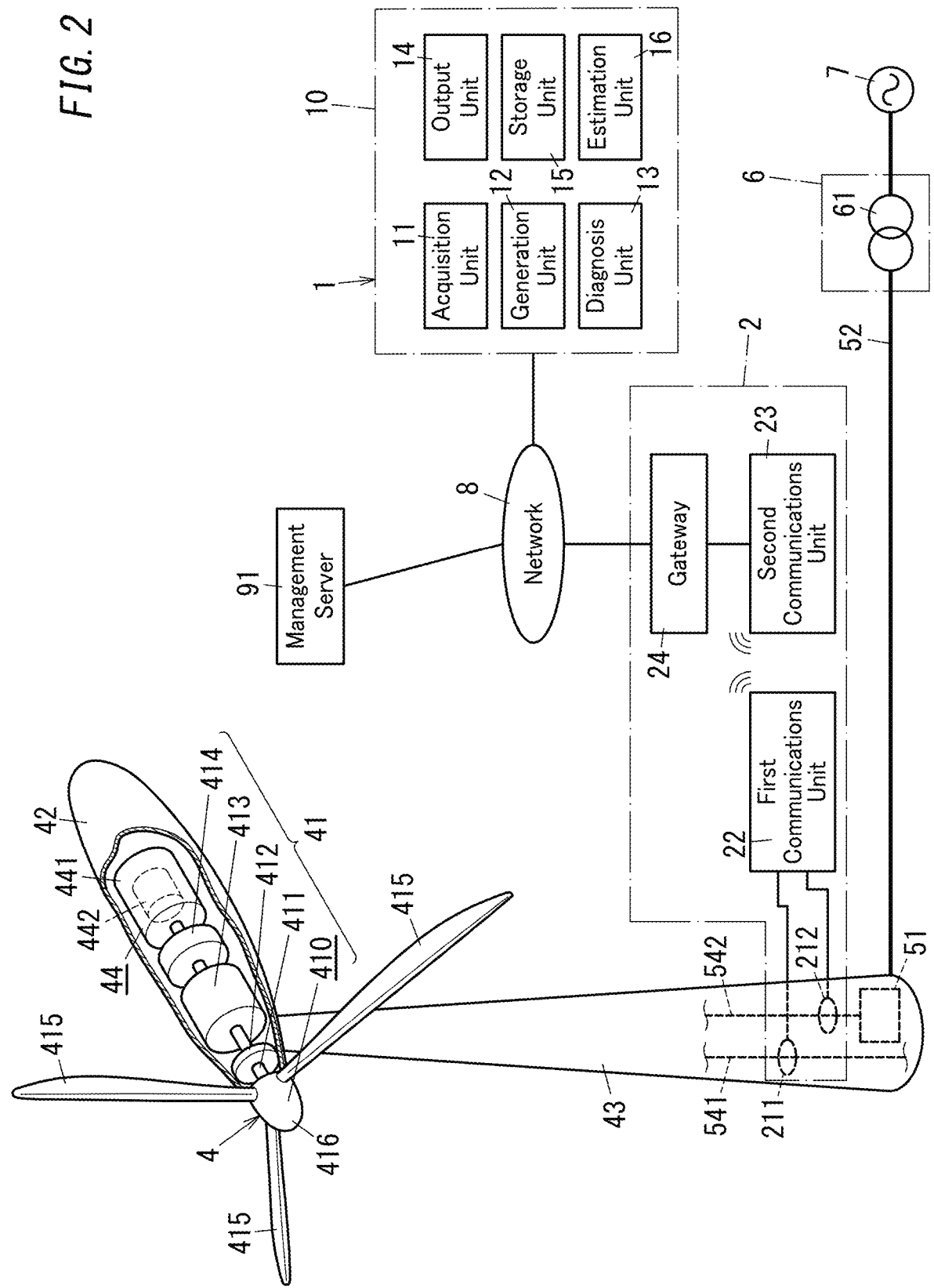
FIG. 2 is a block diagram illustrating a specific configuration for the condition monitoring system.

The converter 4 is a propeller-driven wind turbine facility including, as a rotator 410, a windmill with a plurality of blades 415 as shown in FIG. 2. This converter 4 includes not only the rotator 410 but also a nacelle 42 for holding the rotator 410 rotatably and a tower 43 for supporting the nacelle 42. The nacelle 42 attached to the top of the tower 43 is installed at a height on the order of a few ten meters over the ground. The converter 4 includes a main shaft 411, a bearing 412, a speed-up gear 413, and a brake drum 414, which are arranged inside the nacelle 42 to form the movable block 41 along with the rotator 410. The converter 4 further includes a power generator 44, which is also arranged inside the nacelle 42.

In the example illustrated in FIG. 2, the rotator 410 includes a plurality of (e.g., three in this example) blades 415 and a hub 416. The plurality of blades 415 are arranged radially around the hub 416 and coupled to the main shaft 411 via the hub 416. The main shaft 411 is held rotatably by the bearing 412 inside the nacelle 42 and coupled to the input shaft of the speed-up gear 413. The output shaft of the speed-up gear 413 is connected to the power generator 44 via the brake drum 414. Thus, as the rotator 410 rotates with the plurality of blades 415 exposed to wind, the rotation of the rotator 410 is sped up by the speed-up gear 413 and then transmitted to the power generator 44.

The power generator 44 includes a stator 441 and the mover (rotor) 442. As shown in FIG. 1, the stator 441 includes armature windings 451 and the mover 442 includes field windings 452. The mover 442 is connected to the output shaft of the speed-up gear 413 via the brake drum 414. As the output shaft of the speed-up gear 413 rotates, the mover 442 rotates relative to the stator 441. The armature windings 451 are electrically connected to power supply paths 52 via armature-side electrical paths 541. The field windings 452 are electrically connected to the power supply paths 52 via field-side electrical paths 542 and a power converter 51. The power converter 51 is implemented as a bidirectional inverter as in a back-to-back type power converter, for example.

As used herein, the "armature-side electrical paths 541" refer to respective portions of the electrical paths arranged between the power generator 44 and the power supply paths 52 which are located closer to the armature windings 451 with respect to points of connection of the power converter 51 to the power supply paths 52. On the other hand, the "field-side electrical paths 542" refer to respective portions of the electrical paths arranged between the power generator 44 and the power supply paths 52 which are located closer to the field windings 452 with respect to the power converter 51, i.e., the electrical paths between the power converter 51 and the field windings 452. The field-side electrical paths 542 include a slip ring. In FIG. 1, the armature windings 451 are supposed to be included in the stator 441, and therefore, the same portion is designated by both the reference sign 441 for the stator and the reference sign 451 for the armature windings.

In this embodiment, the power generator 44 may be implemented as a double fed induction generator (DFIG), for example. The power generator 44 of this type performs variable speed operation with the amount of current to flow through the field windings 452 controlled by the power converter 51, thereby outputting an AC voltage at the same frequency (of 50 Hz, for example) as a power grid 7 to the power supply paths 52. If the number of revolutions (rotational speed) of the mover 442 is less than a synchronous speed (i.e., if the mover 442 performs a subsynchronous operation), or if the slip has a positive value, the power converter 51 supplies power from the power supply paths 52 to the field windings 452. As used herein, the "slip" is obtained by subtracting the number of revolutions of the mover 442 from the synchronous speed and dividing the difference by the synchronous speed. On the other hand, if the number of revolutions of the mover 442 is equal to or greater than the synchronous speed (i.e., if the mover 442 performs a supersynchronous operation), or if the slip has a negative value, the power converter 51 supplies power from the field windings 452 to the power supply paths 52. In this case, the units of the number of revolutions and the synchronous speed are both rpm (revolutions per minute). As can be seen, the power generator 44 performs slip frequency control of supplying AC power at a slip frequency to the field windings 452, thus maintaining the power generation frequency as high as that of the power grid 7 even if the number of revolutions of the rotator 410 is not constant. As used herein, the "power generation frequency" refers to the reference frequency of an electrical signal (which may be an AC voltage signal or an AC current signal when the converter 4 is implemented as a power generation facility) that is the output of the converter 4.

The armature-side electrical paths 541 are passed inside the tower 43 to electrically connect the power generator 44 in the nacelle 42 to the power supply paths 52. The power converter 51 is arranged in an inner bottom part of the tower 43. The field-side electrical paths 542 are passed inside the tower 43 to electrically connect the power generator 44 in the nacelle 42 to the power converter 51. In this embodiment, the power grid 7 is supposed to be a three-phase (U, V, and W phases) AC power grid, and therefore, three armature windings 451 and three field windings 452 are provided for the three-phase AC power grid 7. Likewise, the power supply paths 52, armature-side electrical paths 541, and field-side electrical paths 542 are all implemented as three coated electric wires for the three-phase AC power grid 7.

A grid connected facility 6 is electrically connected to the power generator 44 via the power supply paths 52. This allows the power generated by the converter 4 to be transmitted to the grid connected facility 6 via the power supply paths 52. In other words, the grid connected facility 6 is electrically connected as a load to the power generator 44 via the power supply paths 52.

The grid connected facility 6 is a facility for connecting the converter 4 to the power grid 7. In this embodiment, the grid connected facility 6 may include a transformer 61, for example. The power supply paths 52 are electrically connected to the primary winding of the transformer 61. The secondary winding of the transformer 61 is electrically connected to the power grid 7. The output (AC voltage) of the converter 4 is supplied to the power grid 7 after having been adjusted to the voltage and frequency of the power grid 7. Optionally, the grid connected facility 6 may include a protection device such as a disconnector.

In the converter 4 with such a configuration, as the mover 442 rotates, electric power (electric energy) is output from the power generator 44 to the grid connected facility 6 via the power supply paths 52. In other words, the converter 4 allows the mover 442 to rotate with the motive power supplied from the movable block 41 to the mover 442 and converts the kinetic (rotational) energy generated by the mover 442 at this time into electric energy. In this case, the converter 4 outputs an electrical signal with a reference frequency (which may be either an AC voltage signal or an AC current signal). The reference frequency may be, for example, 50 Hz, which is as high as that of the power grid 7.

In this converter 4, an anemoscope for measuring the wind direction and an anemometer for measuring the wind speed are provided for the nacelle 42 such that the converter 4 performs control based on the wind direction and the wind speed. That is to say, the converter 4 generates power efficiently following the wind direction by making a yaw driver, for example, rotate the nacelle 42 along a horizontal plane according to the wind direction. In addition, the converter 4 also controls the output (electric power) of the power generator 44 at a rated value by varying the pitch angle of the blades 415 according to the wind speed.

(2.2) Fault with Movable Block

In the converter 4 with the configuration that has been described in the "(2.1) Converter" section, the movable block 41 could have the following fault, for example.

Specifically, in such a converter 4, the movable block 41 could have some fault due to deterioration with time of some parts of the movable block 41, for example. Particularly in a power generation facility, such as a wind turbine facility, for turning the rotator 410 by utilizing natural energy, the direction and magnitude of force applied to the rotator 410 tends to change so easily and so often that such deterioration with time is inevitable.

For example, when the wind turbine facility is exposed to a blast of wind blowing upward (from down to up), force is applied to the rotator 410 in such a direction as to incline the main shaft 411, which in turn applies stress to the bearing 412 in such a manner as to gouge the bearing 412. Applying such stress repeatedly to the bearing 412 could cause damage to the bearing 412 due to flaking, particularly when the bearing 412 is a roll bearing. As used herein, "flaking" refers to peeling caused on a rolling contact surface or a raceway surface due to rolling fatigue.

Flaking of the bearing 412 increases the damage done to the bearing 412, thus causing a decline in the power generation efficiency of the converter 4. Besides, letting the converter 4 continue to operate in such a condition has the main shaft 411 inclined to cause misalignment. This in turn causes disengagement between the gears of the speed-up gear 413, for example, thus causing significant friction between the gears and thereby possibly doing damage such as chipping or scratches to the gears. Such damage could be done to not only the speed-up gear 413 but also the brake drum 414 and the power generator 44 as well.

In short, letting the converter 4 continue to operate with some fault (such as flaking of the bearing 412) produced in the movable block 41 not only causes a decline in the power generation efficiency of the converter 4 but also could do serious damage to the converter 4 due to the spread of the damage. Thus, the condition monitoring system 1 according to this embodiment gives the user an early warning about the fault with the movable block 41 by diagnosing whether or not the movable block 41 has any fault and notifying the user of the diagnostic result.

(2.3) Configuration of Condition Monitoring System

Next, a configuration for the condition monitoring system 1 will be described.

The condition monitoring system 1 includes a diagnostic device 10 for diagnosing the condition concerning the converter 4 as shown in FIG. 1. In this embodiment, the diagnostic device 10 diagnoses, as the condition concerning the converter 4, whether or not the movable block 41 has any fault. The diagnostic device 10 is configured to acquire waveform data from a measuring device 2 for measuring an electrical signal that is either output or input of the converter 4 and to diagnose, based on this waveform data, the condition concerning the converter 4 (e.g., whether or not the movable block 41 has any fault). In this embodiment, the measuring device 2 measures a current signal (output current) output from the converter 4 as an electrical signal that is the output of the converter 4.

In this embodiment, the diagnostic device 10 and the measuring device 2 are connected to a network 8 such as the Internet, and are configured to communicate with each other, as shown in FIG. 2. This allows the diagnostic device 10 to acquire the waveform data from the measuring device 2 over the network 8. In addition, a management server 91 under the management of the user is also connected to the network 8. This allows the diagnostic device 10 to output a result of the fault diagnosis performed on the movable block 41 to the management server 91 over the network 8. This enables the management server 91 to present the result of the fault diagnosis performed on the movable block 41 to the user. Consequently, the user may take some proactive measures such as maintenance (including checkup and repair) of the power generation facility before serious damage is done to the power generation facility. In this embodiment, the "user" refers to a business proprietor who runs or manages the converter 4, and is supposed to be an organization such as a business enterprise.

Also, even though this embodiment is described on the supposition that the measuring device 2 is not counted among constituent elements of the condition monitoring system 1, the measuring device 2 may also be one of constituent elements of the condition monitoring system 1. Likewise, even though this embodiment is described on the supposition that the converter 4 is not counted among constituent elements of the condition monitoring system 1, the converter 4 may also be one of constituent elements of the condition monitoring system 1. That is to say, the condition monitoring system 1 only needs to include at least the diagnostic device 10, and may further include at least one of the measuring device 2 or the converter 4.

(2.3.1) Measuring Device

The measuring device 2 includes a first sensor 211, a second sensor 212, and a signal processing unit 25 as shown in FIG. 1. The measuring device 2 measures the amount of the output current of the converter 4 (i.e., an electrical signal that is the output of the converter 4) and outputs waveform data representing the waveform of the output current of the converter 4 to the diagnostic device 10.

The first sensor 211 and the second sensor 212 may each be implemented as a current sensor such as a current transformer (CT). The first sensor 211 is disposed in the tower 43 (see FIG. 2) of the converter 4 and attached to the armature-side electrical paths 541 to detect the current flowing through the armature-side electrical paths 541. The second sensor 212 is also disposed in the tower 43 of the converter 4 and attached to the field-side electrical paths 542 to detect the current flowing through the field-side electrical paths 542. The first sensor 211 and the second sensor 212 are both electrically connected to the signal processing unit 25. In this case, each of the first sensor 211 and the second sensor 212 may be attached to at least one of the three-wire armature-side electrical paths 541 or at least one of the three-wire field-side electrical paths 542 for the three-phase AC power grid 7. For example, the first sensor 211 may be attached to either only one of the three armature-side electrical paths 541 or two or all three of the armature-side electrical paths 541.

The signal processing unit 25 generates, based on the output of the first sensor 211, waveform data representing an output current waveform of the armature windings 451 (hereinafter also referred to as "armature-side data"). In addition, the signal processing unit 25 also generates, based on the output of the second sensor 212, waveform data representing an output current waveform of the field windings 452 (hereinafter also referred to as "field-side data"). The measuring device 2 is configured to output, as waveform data representing the waveform of an electrical signal that is the output of the converter 4, the waveform data (including the armature-side data and the field-side data) thus generated by the signal processing unit 25 to the diagnostic device 10.

In this embodiment, the output of the converter 4 includes outputs of the two lines, namely, the output of the armature windings 451 and the output of the field windings 452. However, when "the output of the converter 4" is mentioned simply without a modifier, it herein refers to the output of the armature windings 451. In other words, the measuring device 2 is configured to measure the output (output current) of the armature windings 451 as an electrical signal that is the output of the converter 4.

Next, a more specific configuration for the measuring device 2 will be described with reference to FIG. 2.

The measuring device 2 includes not only the first sensor 211 and the second sensor 212 but also a first communications unit 22, a second communications unit 23, and a gateway 24 as well. In the following description, the function of the signal processing unit 25 (see FIG. 1) is supposed to be included in the first communications unit 22.

The first sensor 211 and the second sensor 212 are arranged near the power converter 51 in an inner bottom part of the tower 43. In other words, the first sensor 211 and the second sensor 212 are arranged in the vicinity of the ground. The first sensor 211 and the second sensor 212 are both electrically connected to the first communications unit 22 and are configured to be able to output the detection result to the first communications unit 22. Any of various types of sensors may be used as the first sensor 211 and the second sensor 212. Nevertheless, the sensors are suitably configured to be attachable afterwards to the armature-side electrical paths 541 and the field-side electrical paths 542 without once disconnecting any of these paths. Examples of this type of sensors include a clamping sensor.

The first communications unit 22 is configured to be able to transmit and receive data to/from the second communications unit 23. The communication between the first communications unit 22 and the second communications unit 23 may be a wireless communication compliant with a low power radio standard (such as the Specific Low Power Radio standard) that requires no licenses, for example. As for this type of low power radio, the frequency band, antenna power, and other specific parameters to be adopted according to the intended use are defined in respective countries. In Japan, for example, a low power radio standard that requires the use of radio waves on the 920 MHz band or the 420 MHz band is defined. However, this is not the only communication method between the first communications unit 22 and the second communications unit 23 but an example. Alternatively, the communication method may also be a communication using a cellular network (carrier network) such as a 3G (third generation) network provided by a communications service provider or may be a cabled communication as well.

The gateway 24 is electrically connected to the second communications unit 23. The gateway 24 may further have the capability of being connected to the network 8 (such as the Internet) over a cellular network (carrier network) such as a 3G (third generation) network provided by a communications service provider, i.e., the capability of a mobile router, for example. However, this configuration is only an example and should not be construed as limiting. Alternatively, the gateway 24 may also be connected to the network 8 not via such a cellular network.

This configuration allows the measuring device 2 to transmit the waveform data (including the armature-side data and the field-side data) generated by the signal processing unit 25 from the first communications unit 22 to the diagnostic device 10 via the second communications unit 23, the gateway 24, and the network 8. The gateway 24 further serves as a data logger for saving the waveform data acquired (collected) from the first communications unit 22.

The electric power to operate the measuring device 2 may be supplied from either the power grid 7 or the converter 4 that is a power generation facility.

The measuring device 2 is configured to output the waveform data to the diagnostic device 10 at regular intervals. The measuring device 2 measures the output current of the converter 4 in predetermined measuring periods (of four hours, for example) and outputs the waveform data thus obtained to the diagnostic device 10. The measuring period may be clocked by either a timer provided for the first sensor 211 and the second sensor 212 or a timer provided for the gateway 24. When clocked by the timer provided for the gateway 24, the measuring period may be remotely set (or changed) by accessing the gateway 24 through the management server 91.

(2.3.2) Diagnostic Device

The diagnostic device 10 includes an acquisition unit 11, a generation unit 12, a diagnosis unit 13, an output unit 14, a storage unit 15, and an estimation unit 16 as shown in FIG. 2. The diagnostic device 10 makes the acquisition unit 11 acquire the waveform data from the measuring device 2 and also makes the diagnosis unit 13 diagnose the condition concerning the converter 4 (e.g., whether or not the movable block 41 has any fault). The diagnostic device 10 includes, as one of its major constituent elements, a computer including a processor and a memory, and performs the function as the diagnostic device 10 by making the processor execute a program stored in the memory.

The acquisition unit 11 is configured to acquire the waveform data, representing the waveform of an electrical signal that is either output or input of the converter 4, from the measuring device 2. In this embodiment, the electrical signal measured by the measuring device 2 is an output current of the converter 4. Thus, the acquisition unit 11 acquires, from the measuring device 2, the waveform data (armature-side data) representing at least the waveform of the output current of the converter 4. In this case, the acquisition unit 11 is configured to acquire the waveform data from the gateway 24 of the measuring device 2 over the network 8. The waveform data acquired by the acquisition unit 11 is raw data representing the current waveform itself, or the current waveform subjected to no processing at all but compression, for example. In this case, the waveform of a current detected by either the first sensor 211 or the second sensor 212 in a predetermined amount of time (falling within the range from a few seconds to about one minute, for example) forms a single set of the waveform data. In this embodiment, the waveform data may be a way file with a data size of about 200 Kbytes per phase, for example.

The generation unit 12 generates, based on the waveform data acquired by the acquisition unit 11, analysis data for monitoring the condition concerning the converter 4 (in this example, diagnosing whether or not the movable block 41 has any fault). The analysis data generated by the generation unit 12 is a data set including at least three variables, namely, frequency fy, feature quantity Sz, and drive frequency fx. As used herein, the "frequency fy" and the "feature quantity Sz" are variables obtained by frequency analysis of the waveform data. As used herein, the "feature quantity Sz" is either the intensity Iz (signal strength) or phase. In this embodiment, the feature quantity Sz is supposed to be the intensity Iz as an example. That is to say, the frequency analysis of the waveform data allows a combination of respective values of the frequency fy and feature quantity Sz (intensity Iz in this example) to be obtained. Also, as used herein, the "drive frequency fx" refers to the frequency of a periodic motion performed by the mover 442. If the mover 442 performs a rotary motion as in this embodiment, then the drive frequency fx corresponds to the number of revolutions of the mover 442. That is to say, since the number of revolutions Ra [rpm] of the mover 442 is obtained by multiplying the drive frequency fx [Hz] by a constant (of 60, for example), the relational expression Ra=60×fx is satisfied.

The generation unit 12 obtains, based on the waveform data generated when the value of the drive frequency fx varies, multiple combinations of the frequency fy and feature quantity Sz (e.g., intensity Iz) values by frequency analysis, thus generating analysis data. Specifically, the generation unit 12 subjects the waveform data representing the waveform of the output current of the converter 4 (armature-side data) to a Fourier transform such as a fast Fourier transform (FFT), thereby obtaining a frequency spectrum of the output current. The generation unit 12 generates the analysis data by obtaining frequency spectra for the respective waveform data with the value of the drive frequency fx varied. An algorithm for making the generation unit 12 generate the analysis data will be described in detail in the "(2.4.1) Generation phase" section.

The diagnosis unit 13 is configured to diagnose, based on the analysis data generated by the generation unit 12, the condition concerning the converter 4 (in this example, whether or not the movable block 41 has any fault). The diagnosis unit 13 analyzes the analysis data generated by the generation unit 12 and diagnoses, following the diagnosis condition, whether or not the movable block 41 has any fault. An algorithm for allowing the diagnosis unit 13 to make a diagnosis will be described in detail later in the "(2.4.2) Diagnosis phase" section.

The output unit 14 outputs the result of the diagnosis made by the diagnosis unit 13. The output unit 14 is configured to transmit the diagnostic result to the management server 91 over the network 8. The diagnostic result output by the output unit 14 is data representing at least the condition concerning the converter 4 (in this example, whether or not the movable block 41 has any fault) and may include data about the spot with the fault, the level (or the degree) of the fault, and a countermeasure. As used herein, the output of the diagnostic result includes presentation (such as display, emission of a voice message, and printing) and notification of the diagnostic result.

The storage unit 15 stores multiple sets of the waveform data acquired by the acquisition unit 11. As used herein, the "multiple sets of the waveform data" may be multiple sets of waveform data detected and obtained by the single first sensor 211 (or the single second sensor 212) a number of times or multiple sets of waveform data obtained based on the outputs of multiple first sensors 211 (or multiple second sensors 212). Still alternatively, the "multiple sets of the waveform data" may also be multiple sets of waveform data obtained by multiple first sensors 211 (or multiple second sensors 212) through multiple measuring sessions. An example in which multiple first sensors 211 (or multiple second sensors 212) are provided will be described later in the "(2.6) Exemplary application of condition monitoring system" section.

The estimation unit 16 is configured to obtain the number of revolutions (or the drive frequency fx) of the mover 442 in the converter 4. That is to say, in the converter 4, the number of revolutions (rotational speed) of the mover 442 is not constant but varies according to the wind speed, for example. Some converters 4 may be provided with an additional rpm monitor for monitoring the number of revolutions of the mover 442. However, the estimation unit 16 is still able to estimate the number of revolutions of the mover 442 even without the rpm monitor.

In this embodiment, the estimation unit 16 is configured to obtain the number of revolutions of the mover 442 based on at least the output of the field windings 452. That is to say, the estimation unit 16 uses at least the waveform data (field-side data) representing the output current waveform of the field windings 452, among the waveform data acquired by the acquisition unit 11, to estimate the number of revolutions of the mover 442. In addition, the estimation unit 16 is also configured to obtain the number of revolutions of the mover 442 based on not only the output of the field windings 452 but also the output of the armature windings 451 as well. That is to say, the estimation unit 16 uses not only the field-side data but also the waveform data (armature-side data) representing the output current waveform of the armature windings 451 to estimate the number of revolutions of the mover 442. An algorithm allowing the estimation unit 16 to estimate the number of revolutions of the mover 442 will be described in detail later in the "(2.4.3) Number of revolutions estimation algorithm" section.

The configuration described above allows the diagnostic device 10 to diagnose, based on the waveform data acquired from the measuring device 2, the condition concerning the converter 4 (in this example, whether or not the movable block 41 has any fault) and output the diagnostic result to the management server 91. Thus, the management server 91 is allowed to present the result of the diagnosis performed on the condition concerning the converter 4 to the user. This allows the user to take some proactive measures such as maintenance (including checkup and repair) of the converter 4 before serious damage is done to the converter 4.

Alternatively, the diagnostic device 10 may be configured to output the diagnostic result only while the converter 4 is operating. The determination whether the converter 4 is operating or not may be made, for example, by the diagnostic device 10 based on the waveform data acquired from the measuring device 2. When finding the converter 4 generating electric power that is equal to or greater than a predetermined minimum required power value, the diagnostic device 10 determines that the converter 4 should now be operating. When finding the converter 4 not operating, the diagnostic device 10 does not diagnose the condition concerning the converter 4 and may output information indicating that the diagnostic device 10 is unable to diagnose the condition concerning the converter 4, for example.

Optionally, the diagnostic device 10 may adopt, as a diagnosis condition for use in the diagnosis unit 13, a predetermined condition defined by default or a condition to be updated as needed from time to time without limitation. If the diagnosis condition needs to be updated from time to time, then the diagnosis unit 13 may update the diagnosis condition based on the multiple sets of waveform data stored in the storage unit 15. In other words, the algorithm allowing the diagnosis unit 13 to make the diagnosis is automatically changed by machine learning. If multiple sets of waveform data are stored in the storage unit 15, then the diagnosis condition may be updated automatically based on those multiple sets of waveform data (i.e., so-called "big data").

(2.4) Operation of Condition Monitoring System

The operation of the condition monitoring system 1 according to this embodiment is roughly classifiable into a generation phase for generating the analysis data to monitor the condition concerning the converter 4 and a diagnosis phase for diagnosing, based on the analysis data, the condition concerning the converter 4. Thus, in the following description, the operation of the condition monitoring system 1 will be described separately about its generation phase and its diagnosis phase.

(2.4.1) Generation Phase

First, the generation phase for generating the analysis data will be described.

Figure 3A:
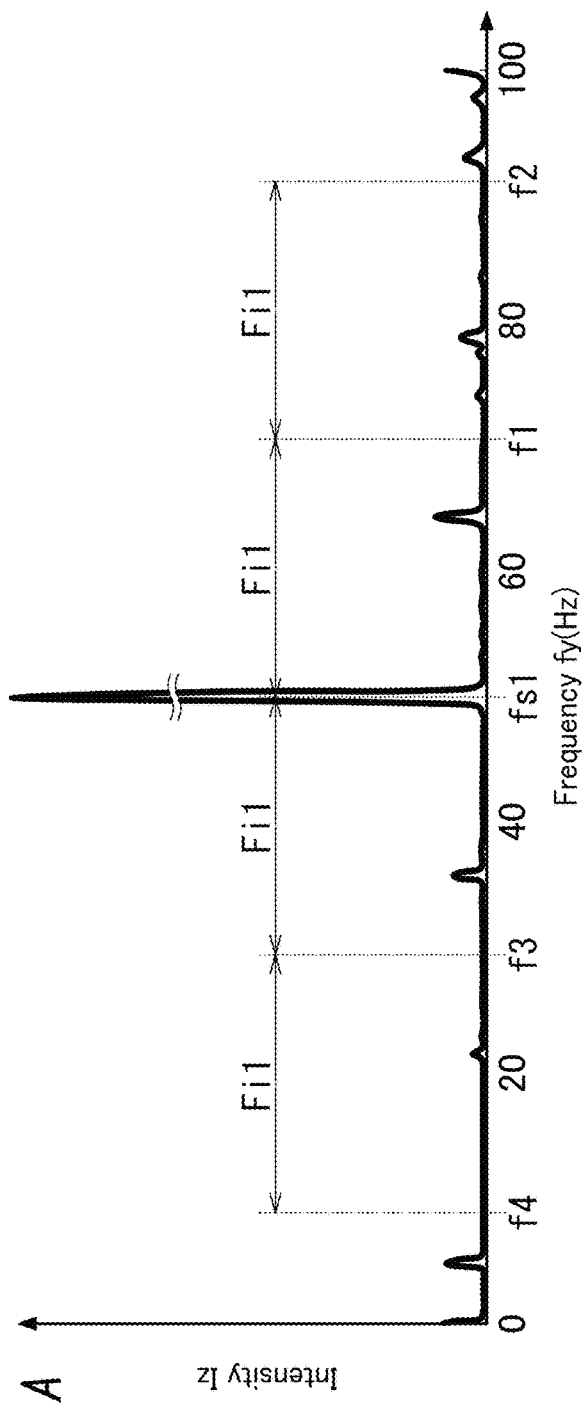
FIG. 3A is a graph showing the frequency spectrum of an output current of an armature winding when no faults are detected.
Figure 3B:
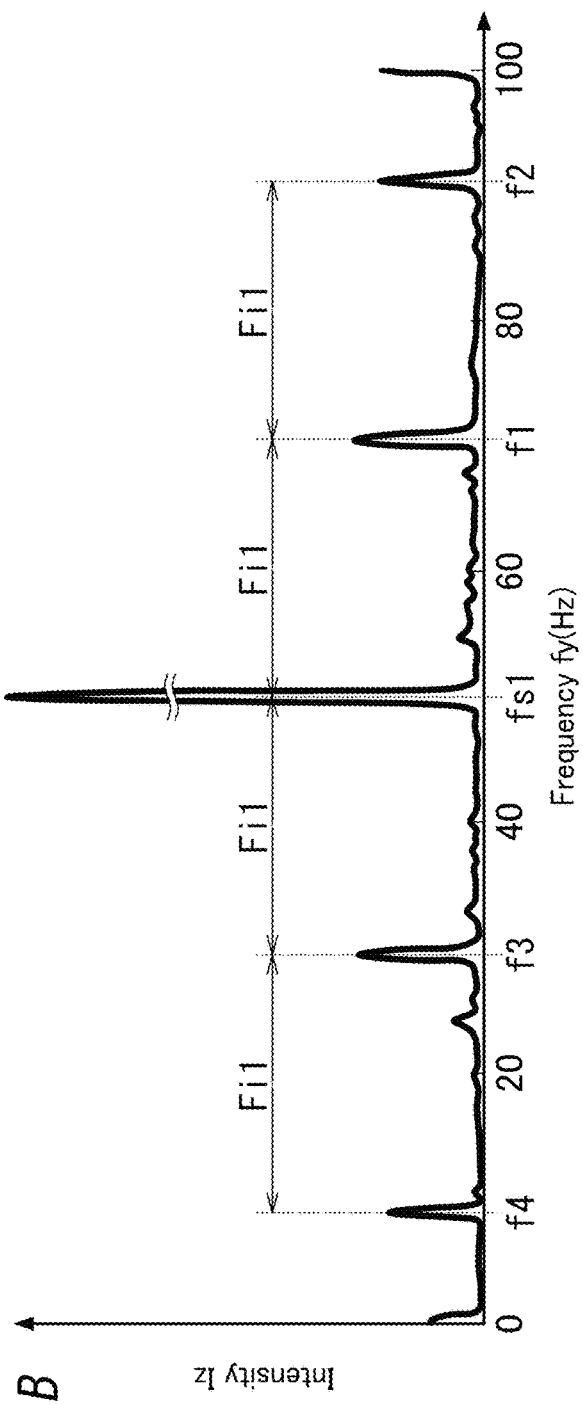
FIG. 3B is a graph showing the frequency spectrum of the output current of the armature winding when any fault is detected.

Suppose a situation where frequency spectra such as the ones shown in FIGS. 3A and 3B are obtained by the generation unit 12 that has made a fast Fourier transform on the waveform data (armature-side data) representing the output current waveform of the converter 4. In FIGS. 3A and 3B, the abscissa indicates the frequency fy (Hz) and the ordinate indicates the intensity Iz (magnitude of component). FIG. 3A shows the result obtained when the converter 4 had no faults (i.e., when the converter 4 turned out to be normal) and FIG. 3B shows the result obtained when the converter 4 had some faults.

As is clear from FIGS. 3A and 3B, when the movable block 41 comes to have any fault, some change is caused in the output current waveform of the converter 4, thus causing some change in the frequency spectra as well. That is why the diagnosis unit 13 may diagnose, by detecting any change in the frequency spectra, whether or not there is any fault.

When the movable block 41 comes to have any fault, various changes may be caused in the frequency spectrum. The present inventors discovered that the presence of any fault would make a difference in at least one particular frequency component. That is to say, in the output current of the converter 4, a distinctive change, caused by the fault with the movable block 41, is observable in at least one particular frequency component. As used herein, the "particular frequency" may refer to, for example, frequencies that are arranged side by side on the axis of the frequency fy at intervals corresponding to the number of revolutions of the mover 442 (hereinafter referred to as "specific intervals") with respect to the reference frequency. As used herein, each of the "intervals" refers to an interval between the frequencies fy on the frequency spectrum. Thus, the interval between two frequencies fy corresponds to the difference between the two frequencies fy. The reference frequency is the frequency of the AC voltage output by the converter 4 (e.g., 50 Hz in the example illustrated in FIGS. 3A and 3B), which is as high as that of the power grid 7.

In the example illustrated in FIGS. 3A and 3B, on the axis of frequencies fy (i.e., on the axis of abscissas), the reference frequency fs1 (of 50 Hz) at which the intensity Iz becomes the maximum and four particular frequencies f1-f4 are arranged at specific intervals Fi1 around the reference frequency fs1. Specifically, on the axis of frequencies fy (on the axis of abscissas), two particular frequencies f1 and f2 are arranged at the specific intervals Fi1 in the range higher than the reference frequency fs1 (where f1<f2). On the other hand, on the axis of frequencies fy (on the axis of abscissas), two particular frequencies f3 and f4 are arranged at the specific intervals Fi1 in the range lower than the reference frequency fs1 (where f3>f4). In other words, the particular frequency f1, the reference frequency fs1, and the specific interval Fi1 satisfy the relation f1=fs1+Fi1. Likewise, the particular frequency f2, the reference frequency fs1, and the specific interval Fi1 satisfy the relation f2=fs1+2×Fi1. Likewise, the particular frequency f3, the reference frequency fs1, and the specific interval Fi1 satisfy the relation f3=fs1−Fi1. Furthermore, the particular frequency f4, the reference frequency fs1, and the specific interval Fi1 satisfy the relation f4=fs1−2×Fi1.

Look at the particular frequencies f1-f4, and it can be seen that each of these frequency components has an increased intensity Iz in the situation where the converter 4 had some faults as shown in FIG. 3B compared with the situation where the converter 4 had no faults as shown in FIG. 3A. That is to say, in the example illustrated in FIG. 3B, the frequency spectrum reaches its local maximum at each of the particular frequencies f1-f4. That is why as shown in FIG. 3B, a plurality of local maximum points are generated on the frequency spectrum at the specific intervals Fi1 with respect to the reference frequency fs1.

The present inventors also confirmed via experiments that any fault with the movable block 41 would cause a distinctive change in the component of at least one of the particular frequencies f1-f4 arranged on the axis of the frequencies fy at the interval (specific interval Fi1) corresponding to the number of revolutions of the mover 442 with respect to the reference frequency fs1. This fact may also be explainable mathematically. In short, when the movable block 41 of the converter 4 comes to have any fault, a periodic variation in angular velocity would be caused in the rotation of the mover 442, and periodic distortion (corresponding to "deviation" from the ideal sinusoidal waveform of the reference frequency fs1) would be caused in the output current of the converter 4. As used herein, one period of the "distortion" corresponds to the number of revolutions of the mover 442. Therefore, regarding the periodic distortion of the output current as a "signal" and the ideal sinusoidal waveform of the reference frequency fs1 as a "carrier," at least one side band will be produced in each of the two ranges that are higher and lower than the carrier (reference frequency fs1) as in a situation where the carrier is modulated by the signal. In this case, the interval between the side bands is the frequency of the signal (i.e., the periodic distortion of the output current), and therefore, the specific interval Fi1 is determined by the number of revolutions of the mover 442 (drive frequency fx). It is clear from the equation of frequency modulation or amplitude modulation that such side bands are produced.

Thus, in the condition monitoring system 1 according to this embodiment, the generation unit 12 performs the generation processing to be described below, thereby generating, based on the waveform data acquired by the acquisition unit 11, analysis data for monitoring the condition concerning the converter 4.

First of all, the generation unit 12 subjects the waveform data to frequency analysis by Fourier transform to obtain a frequency spectrum. In this case, a single frequency spectrum such as the one shown in FIG. 3A or 3B is obtained by fast Fourier transform from a single set of waveform data. The frequency spectrum is data including multiple combinations of frequency fy values (Y1, Y2, Y3, . . . ) and intensity Iz values (Z1, Z2, Z3, . . . ). That is to say, the frequency spectrum is a two-dimensional data set including two variables that are the frequency fy and the feature quantity Sz.

The generation unit 12 generates a plurality of such two-dimensional data sets, each including multiple combinations of frequency fy values (Y1, Y2, Y3, . . . ) and intensity Iz values (Z1, Z2, Z3, . . . ), based on the waveform data obtained when the value (X1, X2, X3, . . . ) of the drive frequency fx varies. The generation unit 12 generates a plurality of frequency spectra by performing frequency analysis on each of the multiple sets of waveform data with respectively different drive frequency fx values. In other words, the generation unit 12 generates a plurality of two-dimensional data sets, each including multiple combinations of frequency fy values (Y1, Y2, Y3, . . . ) and intensity Iz values (Z1, Z2, Z3, . . . ), with respect to various drive frequency fx values (X1, X2, X3, . . . ). Thus, the generation unit 12 generates at least two two-dimensional data sets D1, D2, D3, . . . with respectively different drive frequency fx values (X1, X2, X3, . . . ) as shown in FIG. 4A. In FIG. 4A, each of the plurality of two-dimensional data sets D1, D2, D3, . . . is a graph representing a frequency spectrum such as the ones shown in FIGS. 3A and 3B, i.e., a graph, of which the abscissa indicates the frequency fy and the ordinate indicates the intensity Iz. That is to say, in FIG. 4A, a plurality of two-dimensional data sets D1, D2, D3, . . . , each including multiple combinations of frequency fy values (Y1, Y2, Y3, . . . ) and intensity Iz values (Z1, Z2, Z3, . . . ), are schematically illustrated as graphs.

Specifically, the generation unit 12 obtains a plurality of frequency spectra by subjecting the waveform data, acquired at regular intervals over a certain period of time (ranging from a few days to several weeks, for example), to fast Fourier transform. Each of these frequency spectra thus obtained is a two-dimensional data set including multiple combinations of frequency fy values (Y1, Y2, Y3, . . . ) and intensity Iz values (Z1, Z2, Z3, . . . ). In this case, to each of the plurality of two-dimensional data sets D1, D2, D3, . . . , the generation unit 12 adds, as a label, the value (X1, X2, X3, . . . ) of the drive frequency fx when the waveform data is obtained. The value (X1, X2, X3, . . . ) of the drive frequency fx is a value obtained by multiplying the number of revolutions of the mover 442 by a constant (of 1⁄60) and corresponding to the number of revolutions of the mover 442. Therefore, the value (X1, X2, X3, . . . ) of the drive frequency fx as a label may be estimated by the estimation unit 16 for estimating the number of revolutions of the mover 442.

In addition, in this embodiment, the generation unit 12 also performs sort processing for rearranging the analysis data Da1 according to the drive frequency fx. That is to say, the generation unit 12 rearranges the plurality of two-dimensional data sets D1, D2, D3, . . . according to the value (X1, X2, X3, . . . ) of the drive frequency fx as the label in either the ascending order or the descending order. In this manner, the generation unit 12 generates a plurality of two-dimensional data sets D1, D2, D3, . . . , each including multiple combinations of frequency fy values (Y1, Y2, Y3, . . . ) and intensity Iz values (Z1, Z2, Z3, . . . ), which are arranged in the ascending (or descending) order of the drive frequency fx.

Figure 4B:
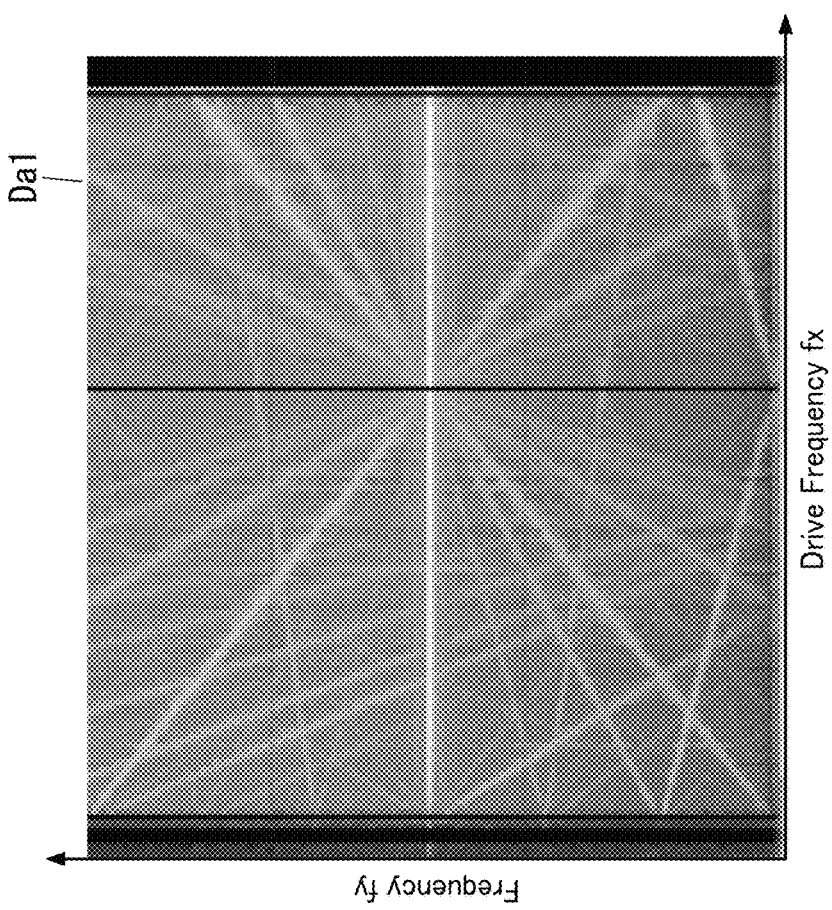
FIG. 4B conceptually illustrates analysis data generated by the condition monitoring system.
Figure 4A:
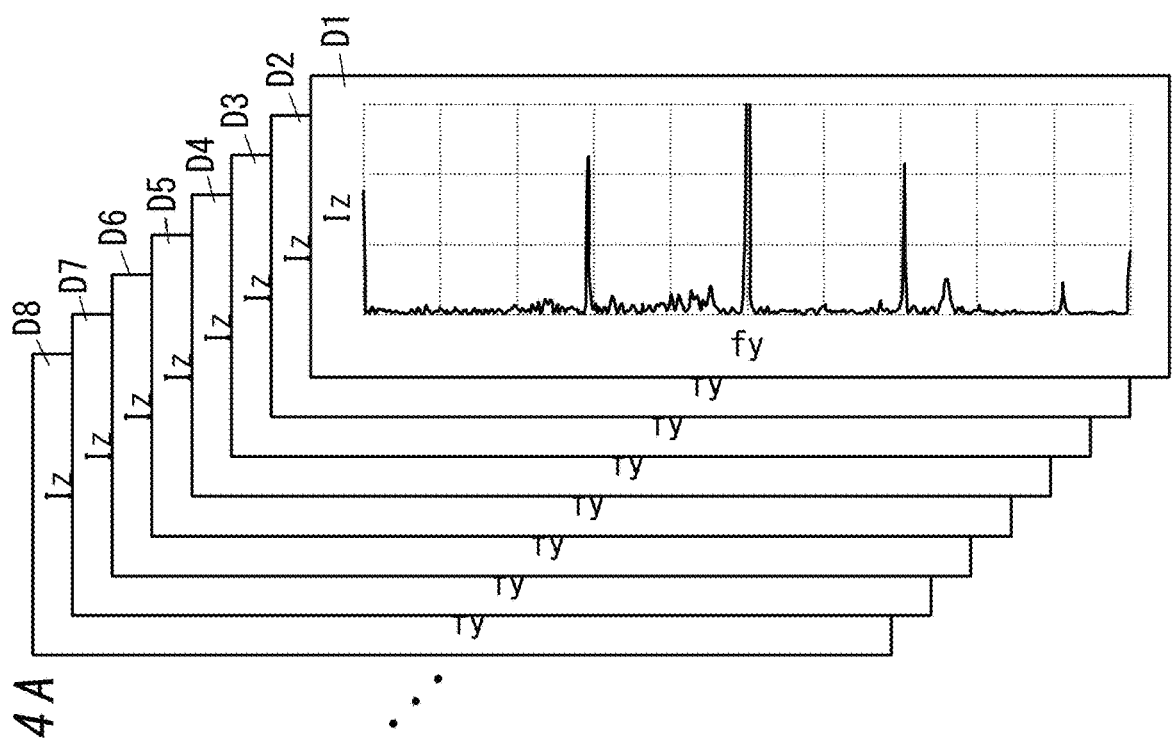
FIG. 4A conceptually illustrates a two-dimensional data set generated by the condition monitoring system.

The generation unit 12 generates analysis data Da1 such as the one shown in FIG. 4B by integrating these two-dimensional data sets D1, D2, D3, . . . together. That is to say, plotting, on a drive frequency fx basis, the plurality of two-dimensional data sets D1, D2, D3, . . . shown in FIG. 4A allows an image, of which the abscissa indicates the drive frequency fx and the ordinate indicates the frequency fy and where pixel values of respective pixels indicate intensities Iz, to be generated. The image generated in this manner corresponds to a three-dimensional data set with three variables, namely, frequency fy, intensity Iz, and drive frequency fx, or the analysis data Da1. The analysis data Da1 is a three-dimensional data set. The analysis data Da1 itself does not have to be an image. In FIG. 4B, the analysis data Da1 is schematically illustrated as an image for illustrative purposes.

Figure 5:
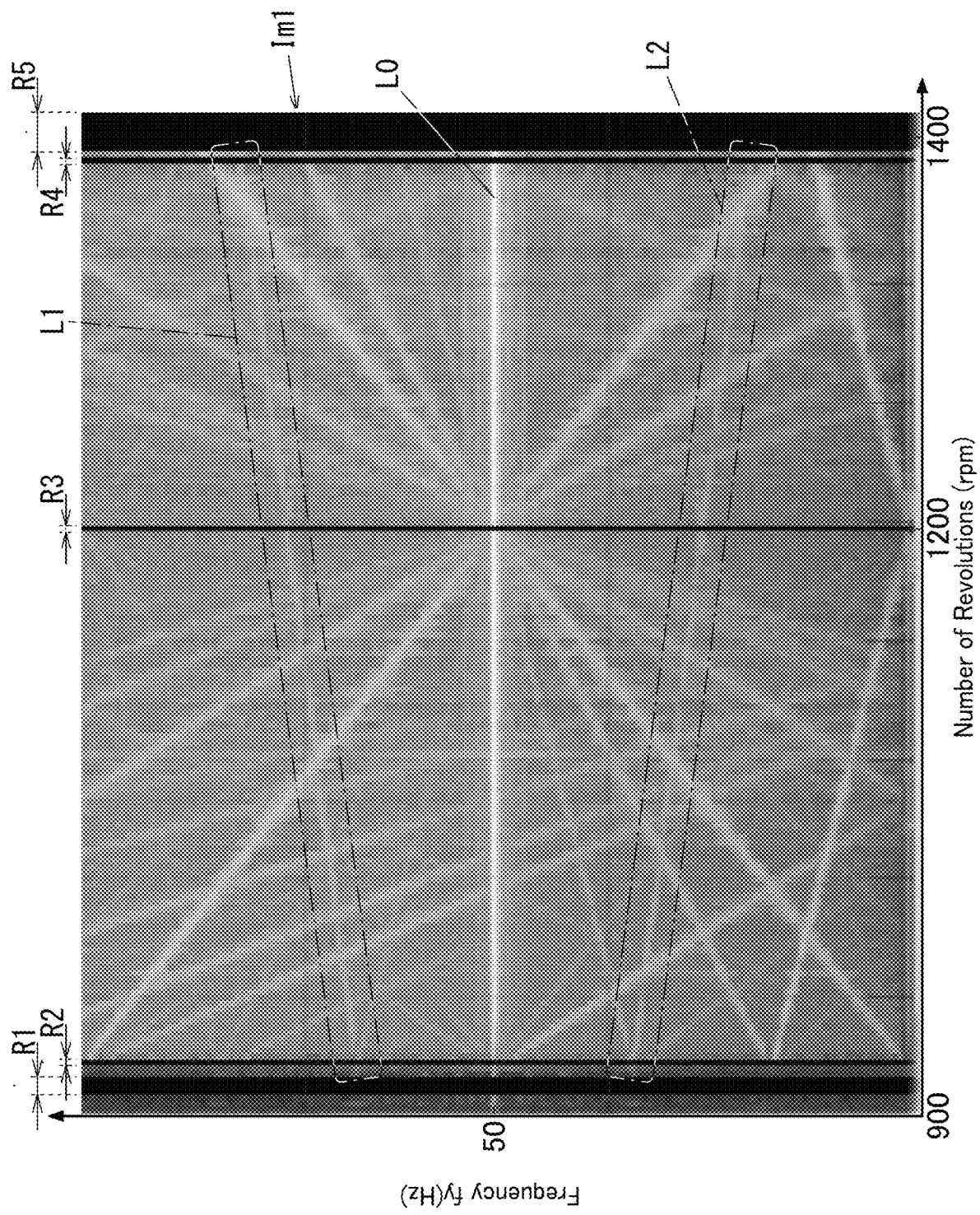
FIG. 5 generally illustrates an image displayed based on the analysis data generated by the condition monitoring system.

A specific example of the analysis data Da1 thus generated will be described with reference to FIG. 5. In this embodiment, the analysis data Da1 is data (image data) to display an image Im1 in which a plurality of pixels, of which the pixel values each represent the intensity Iz, are arranged two-dimensionally with respect to the axis of the frequency fy and the axis of the drive frequency fx (number of revolutions) as shown in FIG. 5. In the example illustrated in FIG. 5, the image Im1 is a monochrome image, and therefore, the pixel values representing the intensities Iz are gray values (luminance values) in multiple grayscales (e.g., 256 grayscales). In the example illustrated in FIG. 5, the higher the intensity Iz is, the greater the pixel value becomes (i.e., the brighter the image Im1 becomes). In this case, the intensity Iz may be either the value itself obtained by frequency analysis or the value obtained by the frequency analysis and subjected to processing such as logarithmic transformation, for example.

That is to say, the analysis data Da1 generated by the generation unit 12 allows an image Im1 such as the one shown in FIG. 5 to be displayed. In FIG. 5, the abscissa has been changed from the drive frequency fx shown in FIG. 4B into the number of revolutions of the mover 442. However, since the number of revolutions of the mover 442 is obtained by multiplying the drive frequency fx by a constant (of 60, for example), the image Im1 shown in FIG. 5 itself is identical with the analysis data Da1 (image) shown in FIG. 4B. In short, in the image Im1 shown in FIG. 5, the abscissa indicates the number of revolutions of the mover 442 corresponding to the drive frequency fx, the ordinate indicates the frequency fy, and pixel values represent intensities Iz. Therefore, the image Im1 shown in FIG. 5 is equivalent to the analysis data Da1 with three variables of frequency fy, intensity Iz, and drive frequency fx.

In this example, in the image Im1 shown in FIG. 5, regions R1, R2, R3, R4, and R5, each having a pixel value of zero and displayed in solid black, correspond to drive frequency fx values at which no two-dimensional data sets have been obtained. As can be seen, the analysis data Da1 does not have to have significant data (such as the frequency fy and the intensity Iz) at all drive frequency fx values falling within a predetermined range. Particularly, in the region R3 where the number of revolutions of the mover 442 is around the synchronous speed (of 1200 rpm in FIG. 5), no two-dimensional data sets are suitably used on purpose to generate the analysis data Da1. This is because in this region R3, it is difficult to determine the sign (+ or −) of a term of the slip frequency fc1 as will be described in detail later in the "(2.4.3) Number of revolutions estimation algorithm" section.

Not all of the multiple two-dimensional data sets D1, D2, D3, ... that form the basis of the analysis data Da1 have to have different drive frequency fx values. Instead, at least two of the multiple two-dimensional data sets need to have mutually different drive frequency fx values. In other words, some of the multiple two-dimensional data sets D1, D2, D3, ... that form the basis of the analysis data Da1 may have the same drive frequency fx value. For example, when the converter 4 is implemented as a wind turbine facility as in this embodiment, the number of revolutions of the mover 442 will vary at random, and therefore, some of the multiple two-dimensional data sets D1, D2, D3, ... tend to have the same drive frequency fx value. If a plurality of two-dimensional data sets D1, D2, D3, ... are provided for the same drive frequency fx, then the generation unit 12 generates the analysis data Da1 by adopting a representative value such as an average, a maximum value, a mode, or a median for the intensity Iz. Specifically, if there are a plurality of two-dimensional data sets for the drive frequency fx of X1, then the generation unit 12 obtains a representative value with respect to the intensity Iz on a frequency fy value (Y1, Y2, Y3, ... ) basis for these two-dimensional data sets. The representative value thus obtained is the intensity Iz value for the respective frequency fy values (Y1, Y2, Y3, ... ) when the drive frequency fx is X1.

The analysis data Da1 generated by the generation unit 12 is suitably once stored in the storage unit 15, for example. In that case, the storage unit 15 constitutes a storage medium for storing the analysis data generated by the generation unit 12.

(2.4.2) Diagnosis Phase

Next, a diagnosis phase will be described in which a diagnosis is made based on the analysis data whether or not the converter 4 has any fault.

In the condition monitoring system 1 according to this embodiment, the diagnosis unit 13 performs diagnosis processing in the following manner to diagnose, based on the analysis data generated by the generation unit 12, the condition concerning the converter 4.

Figure 6:
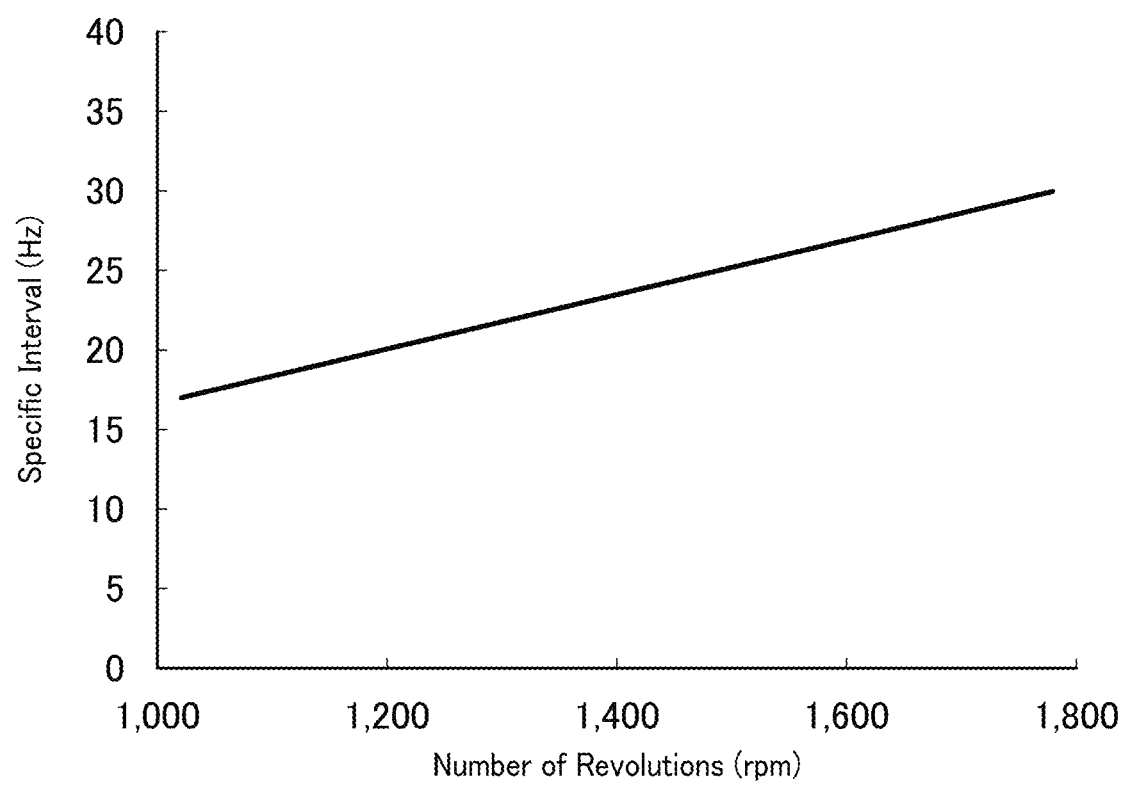
FIG. 6 is a graph showing a relationship between the number of revolutions of a rotor and a specific interval.

Specifically, the diagnosis unit 13 diagnose, based on the component of at least one particular frequency f1-f4 such as the one described above, the condition concerning the converter 4 (in this example, whether or not the movable block 41 has any fault). In this case, the specific interval Fi1 and the number of revolutions of the mover 442 have correlation. As shown in FIG. 6 as an example, as the number of revolutions of the mover 442 increases, the specific interval Fi1 also increases. In FIG. 6, the abscissa indicates the number of revolutions [rpm] of the mover 442 and the ordinate indicates the specific interval [Hz].

Thus, in this embodiment, the diagnosis unit 13 diagnoses the condition concerning the converter 4 based on feature quantity (e.g., intensity Iz in this example) values corresponding to the particular frequency f1-f4 values, among various frequency fy values, in the given analysis data Da1. Specifically, the diagnosis unit 13 extracts bright lines L1 and L2, which are correlated to the number of revolutions of the mover 442, from the image Im1 representing the analysis data Da1 as shown in FIG. 5 and diagnoses the condition concerning the converter 4 based on these bright lines L1 and L2. In FIG. 5, the reference signs L1 and L2 each denote a bright line in a region surrounded with an associated one-dot chain.

That is to say, the bright lines L1 and L2 correspond to two side bands, which are generated in two ranges that are respectively higher and lower than the reference frequency (of 50 Hz in this example) with respect to a bright line L0 on a power generation frequency, i.e., the reference frequency for the output current. Therefore, these bright lines L1 and L2 satisfy the following predetermined relational expression:

$$fy = fs1 + n \times fx \qquad \text{(Equation 1)}$$

where fy is the frequency, fs1 is the reference frequency, n is a coefficient, and fx is the drive frequency. The bright line L1 in the frequency range higher than the reference frequency is a line obtained when n=1 is substituted for n in this relational expression. On the other hand, the bright line L2 in the frequency range lower than the reference frequency is a line obtained when n=−1 is substituted for n in this relational expression. In this case, the coefficient n corresponds to the order of the component (side band) of a particular frequency f1-f4. That is to say, the bright line L1 corresponds to the first-order side band (with the particular frequency f1), and the bright line L2 corresponds to the minus-first-order side band (with the particular frequency f3).

In this embodiment, the analysis data Da1 is data to display the image Im1 such as the one shown in FIG. 5. Thus, displaying the image Im1 on a display device may allow a human to diagnose the condition concerning the converter 4 with his or her own eyes. According to this embodiment, however, the diagnosis unit 13 automatically diagnoses the condition concerning the converter 4 by performing the processing to be described below.

The diagnosis unit 13 determines a coefficient n value when the intensity Iz value, corresponding to multiple combinations of the drive frequency fx values and frequency fy values that are given by the predetermined relational expression using at least the drive frequency fx, frequency fy and coefficient n, satisfies a predetermined condition. Then, the diagnosis unit 13 determines, based on the coefficient n value thus determined, the particular frequency f1-f4. In this case, the predetermined relational expression is the Equation (1) that uses not only the drive frequency fx, frequency fy, and coefficient n but also the reference frequency fs1. Specifically, the diagnosis unit 13 may change (sweep) the coefficient n of the Equation (1) so as to increase the coefficient n from zero at a step of 0.1.

Figure 7:
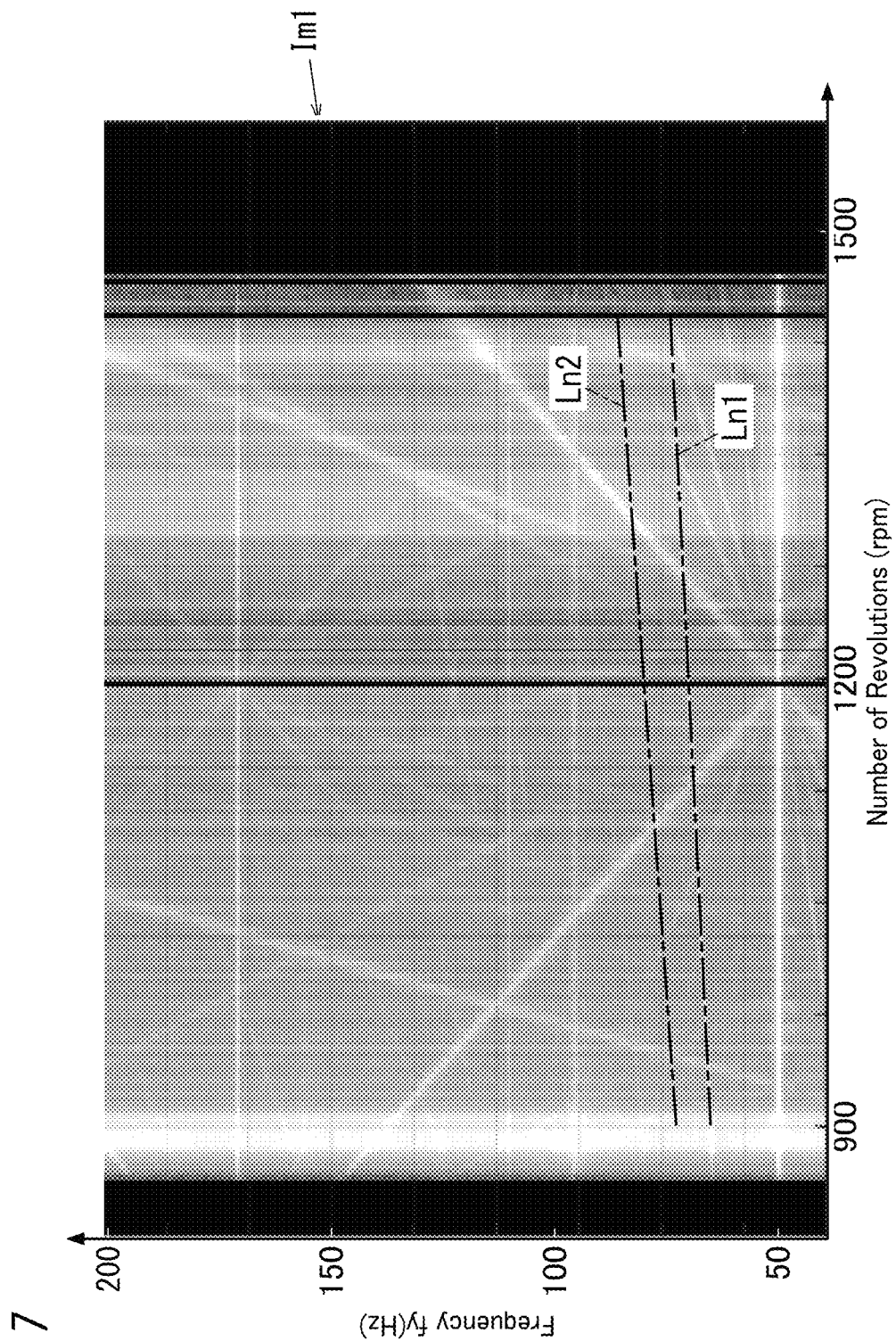
FIG. 7 generally illustrates an image displayed based on the analysis data generated by the condition monitoring system.

FIG. 7 shows a line Ln1 expressed by the Equation (1) where n=1.0 and a line Ln2 expressed by the Equation (1) where n=1.5. In FIG. 7, these two lines Ln1 and Ln2 are drawn on the image Im1 displayed based on the analysis data Da1. In this case, the reference frequency fs1 is supposed to be 50 Hz. That is to say, the diagnosis unit 13 forms a plurality of lines such as the lines Ln1 and Ln2 shown in FIG. 7 by increasing the coefficient n of the Equation (1) from zero at a step of 0.1.

In this case, there are various techniques (predetermined conditions) for the diagnosis unit 13 to determine the particular frequency f1-f4. For example, every time the diagnosis unit 13 increases the coefficient n of the Equation (1) from zero at a step of 0.1, the diagnosis unit 13 may calculate the sum of the intensity Iz values for each coefficient n and obtains a coefficient n at which the sum reaches a local maximum, thereby determining the particular frequency f1-f4. That is to say, the diagnosis unit 13 calculates the sum of the pixel values (corresponding to the intensity Iz values) on each of the lines Ln1 and Ln2. The diagnosis unit 13 obtains a coefficient n, of which the sum of pixel values calculated is larger than any of the sums calculated for surrounding coefficients n and reaches a local maximum value. In this example, the predetermined condition is that while a coefficient n is gradually increased, the sum of the intensity Iz values calculated for the coefficient n should reach a local maximum value. Naturally, the diagnosis unit 13 does not have to increase the coefficient n gradually but may also calculate the sum of the intensity Iz values on a coefficient n basis in a situation where the coefficient n is gradually decreased from a certain value, for example. In another example, while increasing a coefficient n gradually, the diagnosis unit 13 may compare the sum of the intensity Iz values calculated for the coefficient n with a threshold value and may obtain a coefficient n at which the sum exceeds the threshold value. In that case, the predetermined condition is that while a coefficient n is gradually increased, the sum of the intensity Iz values calculated for the coefficient n should exceed the threshold value. Still alternatively, the diagnosis unit 13 may also adopt a predetermined condition that the sum should reach the local maximum value and exceed the threshold value.

Figure 8:
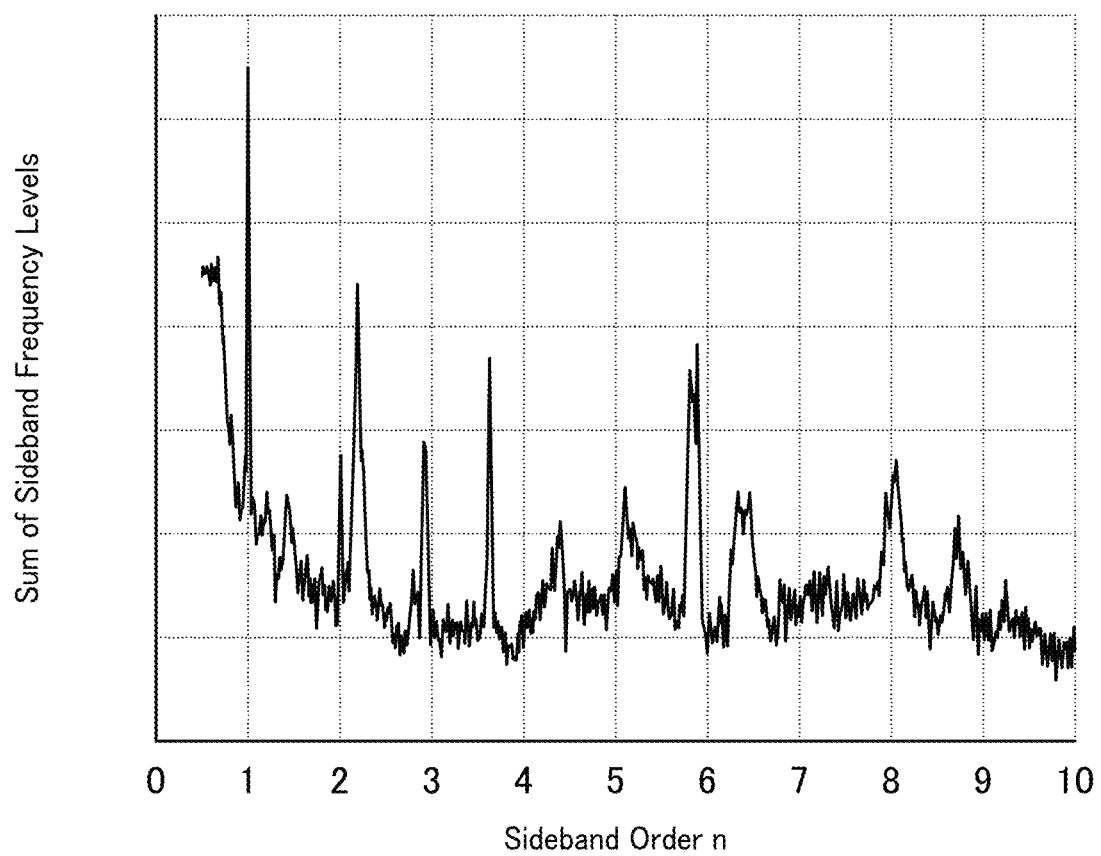
FIG. 8 is a graph showing a relationship between the sideband order n and the sum of sideband frequency levels of the condition monitoring system.

That is to say, in a situation where there are side bands, the sum thus calculated indicates its peak by the order of an associated one of the side bands as shown in FIG. 8. In FIG. 8, the abscissa indicates the coefficient n (side band order) and the ordinate indicates the sum of the intensity Iz values calculated for each coefficient n (i.e., the sum of side band frequency levels). In the example illustrated in FIGS. 7 and 8, a bright line is produced on the line Ln1, and therefore, the sum of the pixel values on the line Ln1 reaches a local maximum value. Thus, the presence of at least "first-order" (where n=1) side band is confirmed. The side band order is determined by the coefficient n obtained in this manner. In other words, the component of the particular frequency f1-f4 is determined.

There are various specific techniques (diagnosis conditions) for diagnosing, based on the intensity Iz of the component of at least one particular frequency f1-f4 thus determined, whether or not there is any fault. For example, the diagnosis unit 13 may diagnose, by comparing the intensity Iz with a threshold value, whether or not there is any fault. In that case, the diagnosis unit 13 may extract the component of at least one particular frequency f1-f4 from the waveform data (armature-side data) and diagnose, when finding the intensity Iz of this component less than the threshold value, that there should be no faults and diagnose, when finding the intensity Iz equal to or greater than the threshold value, that there should be some faults.

In this case, the diagnosis unit 13 may be configured to, when diagnosing that there should be some faults, evaluate the level (or degree) of the fault. That is to say, evaluating the level of the fault to be one of 99 levels from 1 through 99 allows the diagnosis unit 13 to distinguish a fault of an insignificant level from a fault of a significant level. The fault level may be determined based on, for example, the difference between the intensity Iz of the component of the at least one particular frequency f1-f4 and the threshold value.

Alternatively, a specific technique for the diagnosis unit 13 to make the diagnosis may also be, for example, the Mahalanobis-Taguchi method. Still alternatively, the diagnosis unit 13 may also make the diagnosis by some machine learning algorithm such as the k-nearest neighbor method, the support vector machine (SVM) method, or a neural network method. In this case, the neural network method includes deep learning. Note that these specific diagnosis techniques are only examples and should not be construed as limiting. Thus, the specific diagnosis technique may be changed appropriately.

Furthermore, the diagnosis unit 13 only needs to diagnose, based on the component of at least one particular frequency f1-f4, whether or not there is any fault. Thus, the diagnosis unit 13 may make the diagnosis based on only the component of the single particular frequency f1 or based on the components of two or more particular frequencies f1-f4. Also, in the example illustrated in FIG. 3B, there supposed to be four particular frequencies f1-f4 in total, consisting of two particular frequencies in a frequency range higher than the reference frequency fs1 and two more particular frequencies in a frequency range lower than the reference frequency fs1. However, this is only an example and should not be construed as limiting. Alternatively, the particular frequencies may be located in only one of these two frequency ranges that are respectively higher and lower than the reference frequency fs1. Still alternatively, there may be five or more particular frequencies.

(2.4.3) Number of Revolutions Estimation Algorithm

Next, it will be described in detail how the estimation unit 16 operates to estimate the number of revolutions of the mover 442 (i.e., what algorithm the estimation unit 16 uses to estimate the number of revolutions).

The present inventors discovered that in a converter 4 that maintains the power generation frequency at a constant frequency (i.e., the reference frequency fs1) by performing so-called "slip frequency control" in which AC power with a slip frequency is supplied to the field windings 452, the output of the field windings 452 includes information about the slip frequency. The algorithm used by the estimation unit 16 to estimate the number of revolutions is based on this discovery. That is to say, the estimation unit 16 estimates the number of revolutions of the mover 442 based on waveform data representing the output current waveform of the field windings 452 (i.e., field-side data) among the waveform data acquired by the acquisition unit 11.

Specifically, the estimation unit 16 obtains the frequency spectrum of the output current of the field windings 452 by subjecting the field-side data to a fast Fourier transform. Then, the estimation unit 16 analyzes the frequency spectrum to extract a slip frequency. The estimation unit 16 calculates the number of revolutions of the mover 442 by using the slip frequency fc1 obtained from the frequency spectrum of the output current of the field windings 452. That is to say, the reference frequency fs1 is given by the following Mathematical Equation (1) where Ra [rpm] is the number of revolutions of the mover 442, P1 is the number of poles of the power generator 44, and fc1 [Hz] is the slip frequency. Note that the slip frequency fc1 in the following Mathematical Equation (1) is an absolute value:

$$fs1 = \frac{Ra}{60} \cdot \frac{P1}{2} \pm fc1 \qquad \text{[Mathematical Equation 1]}$$

In this equation, the number of poles P1 of the power generator 44 (e.g., P1=4) and the reference frequency fs1 are already known. Therefore, when the slip frequency fc1 is determined, the number of revolutions Ra of the mover 442 is obtained by this Mathematical Equation (1). This allows the estimation unit 16 to estimate the number of revolutions Ra of the mover 442.

Figure 9:
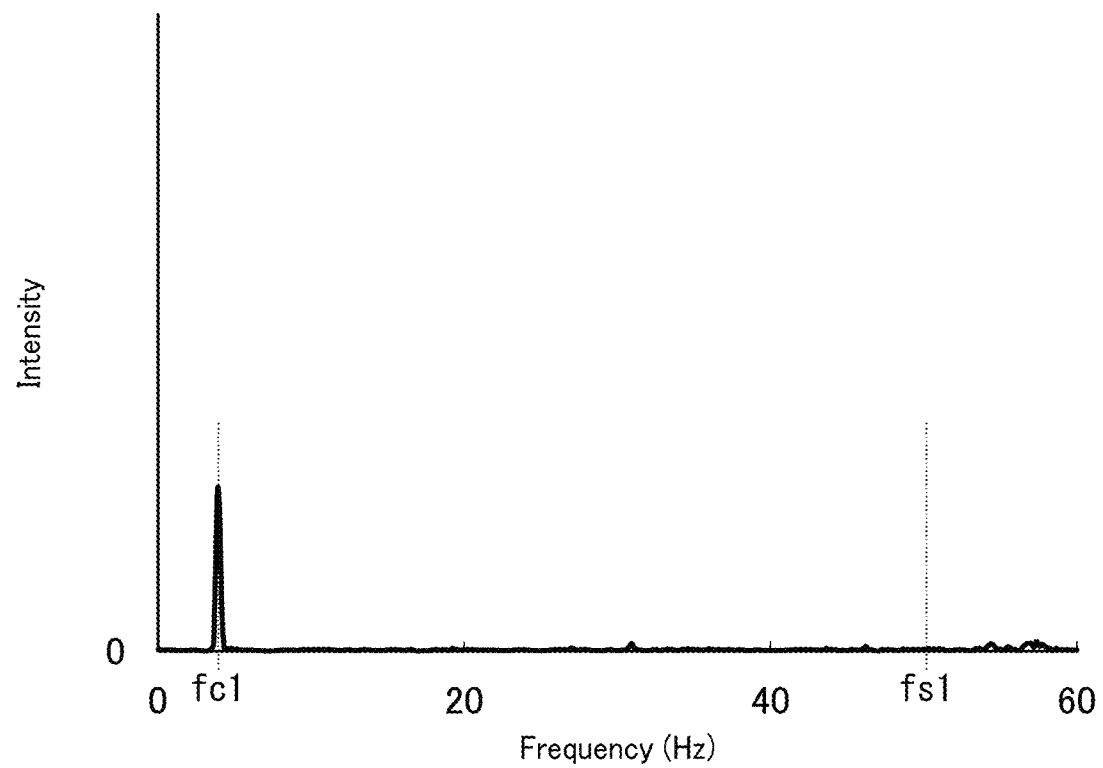
FIG. 9 is a graph showing the frequency spectrum of an output current of a field winding.

Suppose that a frequency spectrum such as the exemplary one shown in FIG. 9 has been obtained by making the estimation unit 16 perform fast Fourier transform on the field-side data. In FIG. 9, the abscissa indicates the frequency [Hz] and the ordinate indicates the intensity (magnitude of the component). As is clear from FIG. 9, as for the output current of the field windings 452, the frequency spectrum reaches a local maximum at the slip frequency fc1. Therefore, as shown in FIG. 9, the frequency spectrum has a local maximum point at the slip frequency fc1. In the example illustrated in FIG. 9, the slip frequency fc1 is 3.875 Hz. In this case, supposing the number of poles P1 of the power generator 44 is four and the reference frequency fs1 is 50 Hz, the number of revolutions Ra of the mover 442 is calculated at 1616.25 rpm by Mathematical Equation (1).

In this case, to accurately obtain the number of revolutions Ra of the mover 442, the estimation unit 16 needs to determine the sign (+/−) of the second term on the right side of Mathematical Equation (1), i.e., the term of the slip frequency fc1. Thus, the estimation unit 16 uses not only the field-side data but also waveform data representing the output count waveform of the armature windings 451 (armature-side data) to estimate the number of revolutions of the mover 442. Specifically, the estimation unit 16 obtains the frequency spectrum of the output current of the armature windings 451 by subjecting the armature-side data to fast Fourier transform. Then, the estimation unit 16 analyzes the frequency spectrum to extract the intensity of the component of the reference frequency fs1 (hereinafter referred to as a "peak level").

The estimation unit 16 determines the sign of the second term on the right side of Mathematical Equation (1) according to the magnitude of the peak level extracted. As the number of revolutions Ra of the mover 442 increases, the output of the converter 4 increases, thus raising the peak level. Therefore, when finding the peak level equal to or greater than a predetermined value, the estimation unit 16 determines that the number of revolutions Ra of the mover 442 should be equal to or higher than the synchronous speed and selects the negative (−) sign. On the other hand, when finding the peak level less than the predetermined value, the estimation unit 16 determines that the number of revolutions Ra of the mover 442 should be less than the synchronous speed and selects the positive (+) sign. In this case, the predetermined value to be compared with the peak level is determined based on statistical data.

Such processing of estimating the number of revolutions Ra is carried out before the generation unit 12 generates the analysis data. That is to say, in a situation where the acquisition unit 11 acquires the waveform data on a regular basis to allow the generation unit 12 to generate the analysis data, the estimation unit 16 performs a series of processing including obtaining the number of revolutions Ra and labeling the number of revolutions Ra (drive frequency fx) every time the waveform data is acquired. Nevertheless, since the fast Fourier transform on the armature-side data is also performed by the generation unit 12, it is not indispensable for the estimation unit 16 to perform fast Fourier transform on the armature data all over again. That is to say, the generation unit 12 and the estimation unit 16 may share the result (frequency spectrum) of the fast Fourier transform on the armature-side data.

Alternatively, even though the estimation accuracy is inferior to the one achieved by the number of revolutions estimation algorithm, the estimation unit 16 may estimate, based on only the waveform data representing the output count waveform of the armature windings 451 (i.e., the armature-side data), the number of revolutions of the mover 442. For example, the estimation unit 16 may analyze the frequency spectrum of the output current of the armature windings 451 and may estimate the number of revolutions of the mover 442 based on the intensity (peak level) of the component of the reference frequency fs1. The peak level increases as the number of revolutions of the mover 442 increases, as described above. Thus, if the correspondence between the peak level and the number of revolutions is known, the number of revolutions may be estimated by the peak level.

(2.6) Exemplary Application of Condition Monitoring System (2.6.1) Configuration Next, a specific exemplary application of the condition monitoring system 1 will be described with reference to FIG. 10.

Figure 10:
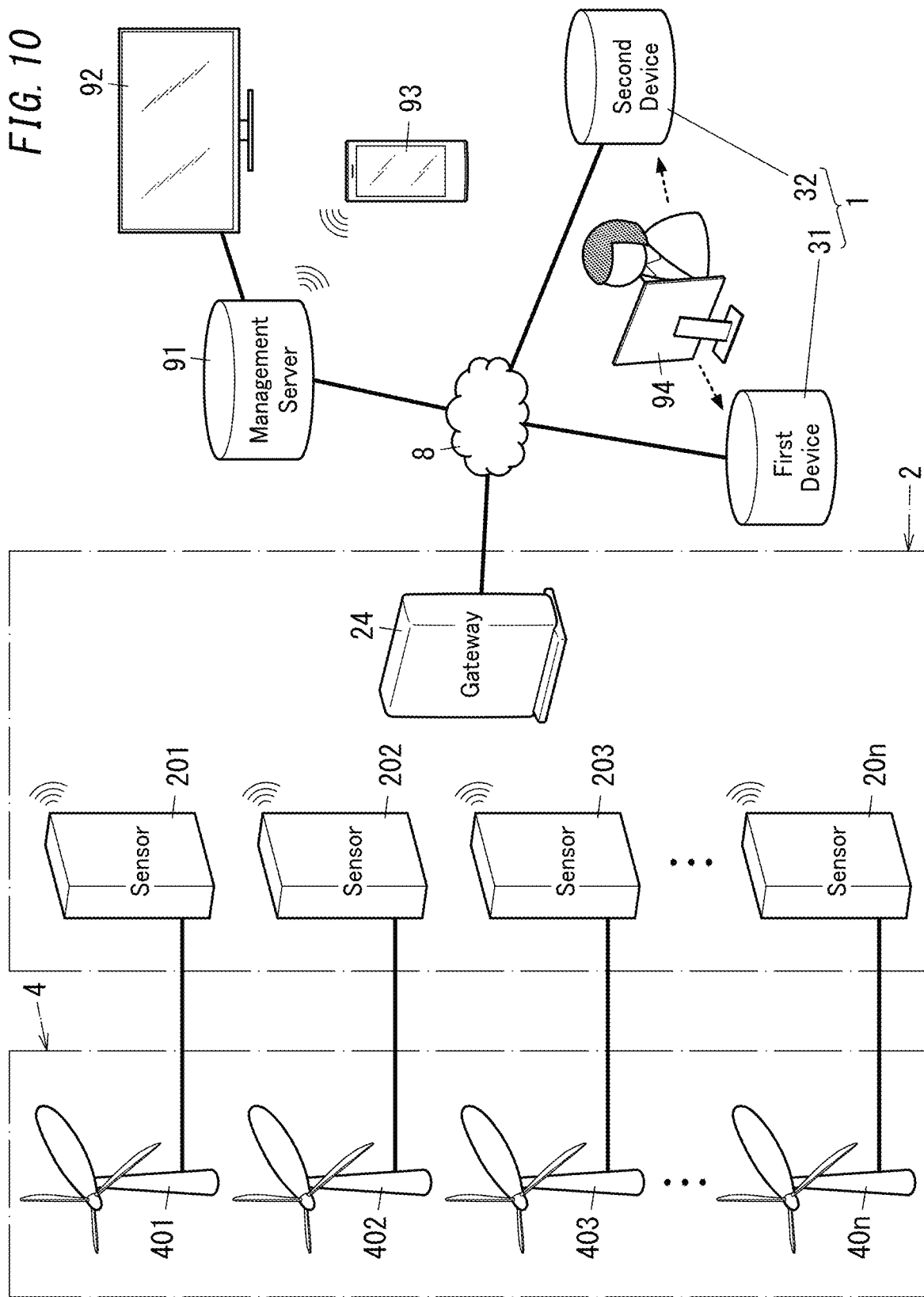
FIG. 10 schematically illustrates an exemplary application of the condition monitoring system according to the first embodiment.

In the example illustrated in FIG. 10, the condition monitoring system 1 includes a first device 31 and a second device 32, each of which transmits and receives data to/from the other device. The functions of the acquisition unit 11, generation unit 12, diagnosis unit 13, output unit 14, storage unit 15, and estimation unit 16 that form the diagnostic device 10 are distributed in the first device 31 and the second device 32. In this example, at least the storage unit 15 is provided for the first device 31, and the generation unit 12 and the diagnosis unit 13 are provided for the second device 32. The first device 31 is provided with not only the storage unit 15 but also the acquisition unit 11 and the output unit 14 as well. The second device 32 is provided with not only the generation unit 12 and the diagnosis unit 13 but also the estimation unit 16 as well.

This allows the first device 31 to perform the functions of accumulating waveform data and outputting (which may be presentation or notification of) the diagnostic result among various functions of the condition monitoring system 1 (diagnostic device 10). The first device 31 further has a user identification (ID) function for identifying the user and a log data management function. On the other hand, the second device 32 performs the functions of analyzing the waveform data, generating analysis data, diagnosing whether or not the movable block 41 has any fault, and estimating the number of revolutions of the mover 442, among various functions of the condition monitoring system 1 (diagnostic device 10). That is to say, the functions of the condition monitoring system 1 are implemented dispersedly in the first device 31 and the second device 32. Making the first device 31 and the second device 32 cooperate with each other allows the capability of the condition monitoring system 1 to be carried out.

In this embodiment, the first device 31 and the second device 32 are each implemented as a cloud computing system. More specifically, the first device 31 is a public cloud computing system installed and established in Country A, and the second device 32 is a private cloud computing system installed and established in Country B. That is to say, the diagnostic device 10 may be implemented as a so-called "hybrid cloud computing system" which is a combination of a public cloud computing system and a private cloud computing system. As used herein, Country A is a country where the converter 4 is installed and where the user belongs. On the other hand, Country B is different from Country A. That is to say, the first device 31 and the second device 32 are installed in two different countries but are able to communicate with each other over the network 8 that is the Internet. In this case, the first device 31 includes the storage unit 15, and therefore, is implemented as a cloud computing system with greater storage capacity than the second device 32.

The first device 31 communicates with the measuring device 2 using non-encrypted data (i.e., a plain text). The first device 31 also communicates with the second device 32 using a plain text. This allows the first device 31 to be used even in a country where people are obliged by regulation, for example, to use plain text. Therefore, even if plain text must be used in Country A, for example, the first device 31 may be used there. Nevertheless, this does not apply to a country or a district where encrypted data communication is permitted. In such a country or district, the first device 31 may establish communication using encrypted data as well.

Furthermore, in the example illustrated in FIG. 10, the converter 4 includes a plurality of wind turbines 401, 402, 403, . . . and 40*n*. Each of the plurality of wind turbines 401, 402, 403, . . . and 40*n* includes the power generator 44 with the stator 441 and the mover 442 just like the converter 4 that has been described in the "(2.1) Converter" section. That is to say, in the example illustrated in FIG. 10, the converter 4 includes a plurality of power generators 44, each converting the kinetic energy of the mover 442 into electric energy.

The plurality of wind turbines 401, 402, 403, . . . and 40*n* together forms a group of power generation facilities. The plurality of wind turbines 401, 402, 403, . . . and 40*n* that form the group of power generation facilities are arranged at an interval of a few ten meters to several kilometers, for example.

Furthermore, the measuring device 2 includes a plurality of sensors 201, 202, 203, . . . and 20*n*. Each of the plurality of sensors 201, 202, 203, . . . and 20*n* corresponds to the combination of the first sensor 211 and the second sensor 212 that has been described in the "(2.3.1) Measuring device" section. That is to say, each of the plurality of sensors 201, 202, 203, . . . and 20*n* detects the current flowing through the armature-side electrical paths 541 and field-side electrical paths 542.

In this case, each of the plurality of sensors 201, 202, 203, . . . and 20*n* is provided one to one for an associated one of the plurality of wind turbines 401, 402, 403, . . . and 40*n*. In other words, each of the plurality of sensors 201, 202, 203, . . . and 20*n* is provided one to one for the power generator 44 (see FIG. 1) of an associated one of the plurality of wind turbines 401, 402, 403, . . . and 40*n*. That is to say, each of the plurality of sensors 201, 202, 203, . . . and 20*n* is attached to the armature-side electrical paths 541 and field-side electrical paths 542 of the associated one of the plurality of wind turbines 401, 402, 403, . . . and 40*n*. The plurality of sensors 201, 202, 203, . . . and 20*n* together forms a group of sensors. In FIG. 10, the plurality of sensors 201, 202, 203, . . . and 20*n* are illustrated as being externally connected to their associated wind turbines 401, 402, 403, . . . and 40*n*. However, this drawing represents their correspondence just schematically. Actually, the plurality of sensors 201, 202, 203, . . . and 20*n* are installed in the wind turbines 401, 402, 403, . . . and 40*n*, respectively.

The first communications unit 22 (see FIG. 2) is connected to each of the plurality of sensors 201, 202, 203, . . . and 20*n*. A single second communications unit 23 (see FIG. 2) is connected to the gateway 24. This allows the plurality of sensors 201, 202, 203, . . . and 20*n* forming the sensor group to establish multiple to one communications with the gateway 24.

Thus, the waveform data of the output currents of the plurality of wind turbines 401, 402, 403, . . . and 40*n* is transmitted from the first communications unit 22, connected to each of the plurality of sensors 201, 202, 203, . . . and 20*n*, to the second communications unit 23 and aggregated together in the gateway 24. In this manner, the measuring device 2 has the waveform data measured by the plurality of wind turbines 401, 402, 403, . . . and 40*n* collected in the single gateway 24.

In this embodiment, identifiers to identify the respective wind turbines 401, 402, 403, . . . and 40*n* have been set in advance, and each of the plurality of sensors 201, 202, 203, . . . and 20*n* is associated with the identifier of a corresponding one of the wind turbines. In addition, each of the plurality of wind turbines 401, 402, 403, . . . and 40*n* is associated with not only their own identifier but also the user ID of a business proprietor who runs and manages the wind turbine. This allows the condition monitoring system 1 to provide, based on the user ID, the user with information about whether or not the wind turbine 401, 402, 403, . . . 40*n* that is run and managed by the user him- or herself has any faults.

In this embodiment, the condition monitoring system 1 (the first device 31 and the second device 32) is configured to diagnose, using the output current detected by an associated one of the plurality of sensors 201, 202, 203, . . . and 20*n* for each of the plurality of power generators 44, whether or not the power generator 44 has any faults. That is to say, the condition monitoring system 1 according to this embodiment is able to diagnose, for each individual one of the plurality of wind turbines 401, 402, 403, . . . and 40*n*, whether or not their movable block 41 has any faults. In this case, the output unit 14 outputs, as the diagnostic results, not only information about whether or not the movable block 41 has any faults but also a piece of information (identifier) indicating a target one of the plurality of wind turbines 401, 402, 403, . . . and 40*n*.

In addition, in the example illustrated in FIG. 10, also provided are a monitor 92 and a mobile terminal 93 which are both connectible to the management server 91. The monitor 92 and the mobile terminal 93 are both under the management of the user and serve as user interfaces for the management server 91 when connected to the management server 91. Thus, when receiving the diagnostic results from the diagnostic device 10, the management server 91 has the diagnostic results displayed on either the monitor 92 or the mobile terminal 93, thus presenting the diagnostic results to the user. In this case, not only the results of diagnosis made by the diagnostic device 10 but also the waveform data stored in the storage unit 15 may be displayed on the monitor 92 or the mobile terminal 93. The mobile terminal 93 is a telecommunications device with the ability to communicate with the management server 91. Examples of the mobile terminal 93 include smartphones and tablet computers.

Besides, in the example illustrated in FIG. 10, further provided is a maintenance terminal 94 for doing maintenance and management on the condition monitoring system 1 (the first device 31 and the second device 32). The maintenance terminal 94 is configured to be able to communicate with the first device 31 and the second device 32. The maintenance terminal 94 may be connected to the first device 31 and the second device 32 either over the network 8 or via a dedicated line. The maintenance terminal 94 is managed by an administrator who runs the condition monitoring system 1, and communicates with either the first device 31 or the second device 32 to change various settings of the condition monitoring system 1 or add new users (user IDs) or change registered user profiles. The maintenance terminal 94 further has the function of checking the operating state of the condition monitoring system 1 in terms of the results of diagnosis made by the condition monitoring system 1, for example.

(2.6.2) Operation

Figure 11:
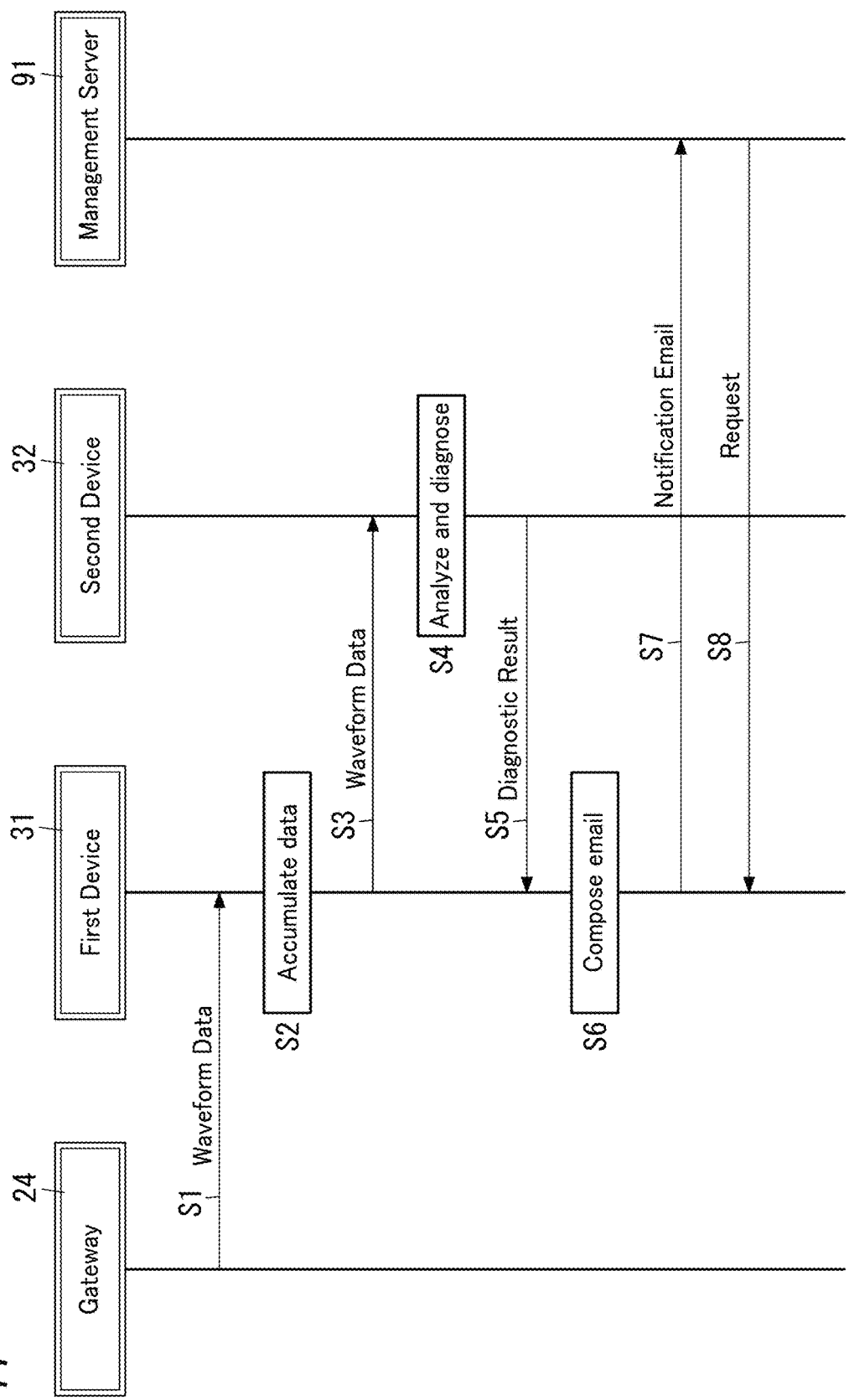
FIG. 11 is a sequence chart showing the operation of the condition monitoring system in the exemplary application shown in FIG. 10.

Next, it will be described with reference to FIG. 11 how the condition monitoring system 1 with the configuration shown in FIG. 10 operates.

The measuring device 2 measures a current waveform on a regular basis, and transmits waveform data representing the current waveform from the gateway 24 to the first device 31 of the condition monitoring system 1 over the network 8 (in S1). At this time, the measuring device 2 has the current waveforms, measured by the plurality of sensors 201, 202, 203, . . . and 20n, buffered in the gateway 24 and then transmitted to the first device 31. A piece of information (identifier) indicating a target one of the plurality of wind turbines 401, 402, 403, . . . and 40n is further added as supplementary data to the waveform data.

On receiving the waveform data from the gateway 24, the first device 31 accumulates the waveform data in the storage unit 15 (in S2). In this case, the first device 31 stores the waveform data along the time series for the respective wind turbines 401, 402, 403, . . . and 40n. The waveform data stored by the first device 31 will not be erased automatically but will remain in the storage unit 15 until a predetermined type of operation is performed by the maintenance terminal 94. In addition, the first device 31 further transmits the waveform data to the second device 32 over the network 8 (in S3).

On receiving the waveform data from the first device 31, the second device 32 has the waveform data analyzed by the generation unit 12 and the diagnosis unit 13, and diagnoses, based on the analysis data, whether or not the movable block 41 has any faults (in S4). At this time, the second device 32 stores the waveform data and the analysis data, obtained by the analysis of the waveform data, in the storage. The second device 32 transmits the diagnostic results to the first device 31 over the network 8 (in S5).

On receiving the diagnostic results from the second device 32, the first device 31 makes the output unit 14 compose an email message to output the diagnostic results (in S6). In this case, the first device 31 serves as a Web server to provide a webpage indicating the diagnostic results. Therefore, the email message includes a link with the universal resource locator (URL) to the webpage indicating the diagnostic results on the Internet. The first device 31 transmits, as a notification email message, the email message thus composed to the management server 91 over the network 8 (in S7).

On receiving the notification email message, the management server 91 forwards the notification email message to either the monitor 92 or the mobile terminal 93. This makes the webpage indicating the diagnostic results ready to be accessed by the user when he or she clicks or taps on the link in the notification email message displayed on either the monitor 92 or the mobile terminal 93. When the user attempts to access the URL of the webpage, the management server 91 transmits a request to the first device 31 (in S8). As a result, the browser capability of either the monitor 92 or the mobile terminal 93 makes the diagnostic results on the webpage readable and available for the user. That is to say, in this case, the management server 91 serves as a proxy server for performing access control between the monitor 92 or the mobile terminal 93 and the network 8.

(3) Variations

The condition monitoring system 1 described above is only an example of the present disclosure. The condition monitoring system 1 according to the present disclosure should not be construed as being limited to the first embodiment described above but may be readily modified, depending on a design choice or any other factor, without departing from a true spirit and scope of the present disclosure.

The target to be monitored by the condition monitoring system 1 may be the converter 4 with the following configuration. Specifically, in the converter 4 to be monitored, its mover 442 only needs to include the field windings 452 electrically connected to the power supply paths 52 via the power converter 51 and the converter 4 only needs to be configured to convert the kinetic energy of the mover 442 to electric energy and output the electric energy to the power supply paths 52. Therefore, the target to be monitored by the condition monitoring system 1 does not have to be a wind turbine facility but may also be hydroelectric power generation facility, a fire power generation facility, a nuclear power generation facility, a geothermal power generation facility, a pumping power generation facility, or a wave power generation facility. If the converter 4 is implemented as a power generation facility other than a double fed induction generator (e.g., when implemented as a synchronous generator), the reference frequency of the AC voltage output by the converter 4 is variable according to the number of revolutions of the rotator 410. That is to say, the reference frequency of the AC voltage output by the converter 4 does not have to be constant but may be variable.

Alternatively, the converter 4 may also be implemented as, for example, an electric motor (motor) for converting electric energy to the kinetic energy of the mover 442. In that case, the condition monitoring system 1 acquires waveform data representing the waveform of an electrical signal (such as a drive current) that is input to the converter 4 and may monitor, based on the waveform data, information about the converter 4. Optionally, when the converter 4 is implemented as an electric motor, a test mode for rotating the mover 442 intentionally with external force applied to (the output shaft of) the mover 442 of the converter 4 may be set. In that case, even if the converter 4 is implemented as an electric motor, the condition monitoring system 1 may also acquire waveform data representing the waveform of an electrical signal (such as a voltage signal or a current signal) that is the output of the converter 4 and monitor, based on the waveform data, information about the converter 4.

Furthermore, the analysis data does not have to be generated based on the output current of the converter 4 but may also be generated based on the waveform data representing the waveform of the output voltage of the converter 4, for example. That is to say, the waveform data for use to generate the analysis data only needs to be an electrical signal that is either output or input of the converter 4, and therefore, does not have to be a current signal but may also be a voltage signal.

Furthermore, the analysis data does not have to be a monochrome image representing the intensity Iz by a gray value (luminance value) as pixel values, but may also be data to display a color image representing the intensity Iz by a hue or saturation as pixel values. Furthermore, the analysis data does not have to be an image representing the intensity Iz by pixel values but may also be data to display, for example, an image of a three-dimensional graph with three axes indicating frequency, drive frequency, and intensity, respectively. Moreover, the analysis data does not have to be data to display an image, but may also be data in the form of a table, for example.

The feature quantity Sz, which is one of variables included in the analysis data, does not have to be the intensity Iz but may also be a phase. Also, the analysis data only needs to include the three variables of frequency fy, feature quantity Sz (which is either the intensity Iz or the phase), and drive frequency fx and does not have to be three-dimensional data. Alternatively, the analysis data may also be four-dimensional data including, as variables, not only frequency fy, feature quantity Sz (which is either the intensity Iz or the phase), and drive frequency fx, but also a point in time indicating the timing when the waveform data is acquired. In that case, the condition monitoring system 1 is allowed to extract, for example, time-dependent factors from the analysis data and make a more specific, or more accurate, diagnosis including the type of the fault. Still alternatively, the analysis data may even be five-dimensional data or data with more dimensions including five or more variables.

Furthermore, the condition concerning the converter 4 to be monitored by the condition monitoring system 1 does not have to be fault with the converter 4 due to deterioration. Alternatively, a diagnosis may also be made, by using the condition monitoring system 1 before the converter 4 starts to be operated actually, whether or not there is any fault such as initial failure with the converter 4. Furthermore, the condition monitoring system 1 is applicable for use to monitor any condition in general concerning the converter 4. Therefore, not only any fault with the converter 4 but also the operating (running) state of the converter 4 or the life of the converter 4 may also be monitored as the condition concerning the converter 4. Optionally, the condition monitoring system 1 may monitor, as the condition concerning the converter 4, not only the condition of the converter 4 itself but also the condition of a mechanism part mechanically coupled to the converter 4 (such as the condition of a gearbox coupled to the output shaft of the converter 4 implemented as an electric motor).

Furthermore, the analysis data may also be used to monitor an even wider variety of conditions concerning the converter 4. For example, the analysis data could be used to locate the fault with either the converter 4 itself or a mechanism part mechanically coupled to the converter 4 based on values of the feature quantity Sz corresponding to frequency fy values other than the particular frequencies f1-f4, for example. Furthermore, the feature quantity Sz values (e.g., pixel values on a line parallel to the axis of abscissas in the exemplary image Im1 shown in FIG. 7) in a situation where the frequency fy is supposed to have a fixed value without depending on the drive frequency fx may also be used to monitor the condition concerning the converter 4.

Furthermore, the information acquired by the estimation unit 16 about the number of revolutions of the mover 442 does not have to be used to have the analysis data generated by the generation unit 12 but may also be used for any other purpose as well. In that case, the condition monitoring system 1 needs to include at least the acquisition unit 11 and the estimation unit 16 and may have no generation unit 12. If the information about the number of revolutions is used for a purpose other than having the analysis data generated by the generation unit 12, then the information estimated by the estimation unit 16 about the number of revolutions of the mover 442 may be transmitted from the output unit 14 to the management server 91 over the network 8, for example. This allows the management server 91 to present the information about the number of revolutions of the mover 442 to the user.

Furthermore, the first device 31 and the second device 32 do not have to be implemented as cloud computing systems but may also be implemented as computers such as server computers. Moreover, the condition monitoring system 1 needs to include at least the first device 31 and the second device 32, and the functions of the condition monitoring system 1 may also be distributed in three or more devices. For example, the generation unit 12 may be provided dispersedly in a plurality of devices. In a specific example, among various functions of the generation unit 12, the function of performing frequency analysis, the function of performing sort processing based on the result of the frequency analysis, and the function of generating image data to display the image Im may be distributed appropriately. Besides, the condition monitoring system 1 does not necessarily include the first device 31 and the second device 32 but the functions of the condition monitoring system 1 may be implemented by a single device as well. Optionally, the first device 31 and the second device 32 may also be installed in the same country.

Furthermore, the respective functions of the condition monitoring system 1 do not have to be allocated to the first device 31 and the second device 32 as in the example described above. Alternatively, the output unit 14 may be included, for example, in the second device 32, instead of the first device 31. In that case, the results of the diagnosis made by the diagnosis unit 13 will be output from the output unit 14 of the second device 32 without being sent back to the first device 31.

Furthermore, the measuring device 2 does not have to be configured to output the waveform data on a regular basis. Alternatively, the measuring device 2 may also be configured to output the waveform data to the diagnostic device 10 in response to a measurement request submitted by the user. In that case, the user's performing a predetermined type of operation on the mobile terminal 93 causes a measurement request to be transmitted from the management server 91 to the measuring device 2. This measurement request triggers transmission of the waveform data from the measuring device 2 to the diagnostic device 10.

Furthermore, the measuring device 2 does not have to be configured to determine, based on the condition signal supplied from the converter 4, whether or not the converter 4 is now operating. Alternatively, the measuring device 2 may also make the determination based on the output of either the first sensor 211 or the second sensor 212, for example.

Optionally, the condition monitoring system 1 may also be configured to determine even spoilage to be caused extemporaneously, such as damage done by whirlwind to the movable block 41, to be fault with the movable block 41. In that case, the output unit 14 suitably presents such spoilage caused extemporaneously and the deterioration of the movable block 41 with time through normal use of the converter 4 (such as flaking of the bearing 412) while distinguishing the former from the latter.

Furthermore, the first sensor 211 and second sensor 212 of the measuring device 2 do not have to be installed inside of the tower 43 of the converter 4 but may also be installed outside of the tower 43.

(4) Condition Monitoring Method, Condition Monitoring Program, and Storage Medium The same functions as those of the condition monitoring system 1 described above may also be implemented as a condition monitoring method, a condition monitoring program, or a storage medium that stores the analysis data.

A condition monitoring method according to an aspect is a condition monitoring method for monitoring a condition concerning a converter 4 to convert the energy of a mover 442, performing a periodic motion at a variable drive frequency fx, unidirectionally from kinetic energy to electric energy or from electric energy to kinetic energy, or bidirectionally between kinetic energy and electric energy. The condition monitoring method includes acquisition processing and generation processing.

A condition monitoring program according to another aspect is a condition monitoring program for monitoring a condition concerning a converter 4 to convert the energy of a mover 442, performing a periodic motion at a variable drive frequency fx, unidirectionally from kinetic energy to electric energy or from electric energy to kinetic energy, or bidirectionally between kinetic energy and electric energy. The condition monitoring program is designed to make a computer system perform acquisition processing and generation processing.

The acquisition processing includes acquiring waveform data, representing a waveform of an electrical signal that is either output or input of the converter 4, from a measuring device 2 to measure the electrical signal. The generation processing includes generating, based on the waveform data, analysis data to monitor the condition concerning the converter 4. The generation processing includes obtaining, by frequency analysis, a plurality of combinations, each including a value of a frequency fy and a value of a feature quantity Sz that is either intensity Iz or phase, based on the waveform data when a value of the drive frequency fx varies and thereby generating the analysis data having at least three variables including the frequency fy, the feature quantity Sz, and the drive frequency fx.

A condition monitoring method according to another aspect is a method for monitoring a condition concerning a converter 4 to convert energy of a mover 442, performing a periodic motion at a variable drive frequency fx, unidirectionally from kinetic energy to electric energy or from electric energy to kinetic energy, or bidirectionally between kinetic energy and electric energy. The condition monitoring method includes diagnosis processing including diagnosing the condition concerning the converter 4 based on analysis data to be generated from waveform data representing a waveform of an electrical signal that is either output or input of the converter 4.

A condition monitoring program according to another aspect is a program for monitoring a condition concerning a converter 4 to convert energy of a mover 442, performing a periodic motion at a variable drive frequency fx, unidirectionally from kinetic energy to electric energy or from electric energy to kinetic energy, or bidirectionally between kinetic energy and electric energy. The condition monitoring program makes a computer system execute diagnosis processing including diagnosing the condition concerning the converter 4 based on analysis data to be generated from waveform data representing a waveform of an electrical signal that is either output or input of the converter 4.

The analysis data is generated by obtaining, by frequency analysis, a plurality of combinations, each including a value of a frequency fy and a value of a feature quantity Sz that is either intensity Iz or phase, based on the waveform data when a value of the drive frequency fx varies. The analysis data has at least three variables including the frequency fy, the feature quantity Sz, and the drive frequency fx.

These condition monitoring methods and condition monitoring programs make the condition monitoring system 1 according to the first embodiment (including its variations) implementable even without using any dedicated diagnostic device 10, thus facilitating introduction of the condition monitoring system 1. In that case, the computer system may include, as major hardware components, a processor and a memory. The functions of the condition monitoring system 1 according to the present disclosure may be performed by making the processor execute a condition monitoring program stored in the memory of the computer system. The processor of the computer system may be made up of a single or a plurality of electronic circuits including a semiconductor integrated circuit (IC) or a largescale integrated circuit (LSI). Those electronic circuits may be either integrated together on a single chip or distributed on multiple chips without limitation. Those multiple chips may be integrated together in a single device or distributed in multiple devices without limitation. The condition monitoring program may be stored in advance in the memory of the computer system. However, this is only an example and should not be construed as limiting. Alternatively, the condition monitoring program may also be downloaded through a telecommunications line or be distributed after having been recorded in some non-transitory storage medium such as a memory card, an optical disc, or a hard disk drive, any of which is readable for the computer system.

Furthermore, even when the condition monitoring system 1 according to the first embodiment (or a variation thereof) is implemented by the condition monitoring method and the condition monitoring program, any of the various configurations described above and the configuration to be described below for a second embodiment may be adopted in combination as appropriate. For example, in the condition monitoring method, the generation processing may include sort processing to be performed by the generation unit 12.

Second Embodiment

In a condition monitoring system 1 according to a second exemplary embodiment, the diagnosis unit 13 diagnoses, without using the number of revolutions, estimated by the estimation unit 16, of the mover 442, whether or not the movable block 41 has any fault, which is a major difference from the condition monitoring system 1 of the first embodiment described above. In the following description, any constituent element of this second embodiment, having the same function as a counterpart of the first embodiment described above, will be designated by the same reference numeral as that counterpart's, and a detailed description thereof will be omitted herein.

That is to say, in this embodiment, the diagnosis unit 13 acquires information about the number of revolutions of the mover 442 from, for example, an rpm monitor or any other suitable device but the estimation unit 16. Then, the generation unit 12 adds, as a label, the value of the drive frequency fx (or the number of revolutions of the mover 442) when the waveform data is obtained to each of the multiple two-dimensional data sets D1, D2, D3, . . . , thereby generating the analysis data.

As can be seen, if the rpm monitor, for example, is additionally provided for the converter 4, the generation unit 12 may generate the analysis data based on the output of the rpm monitor. This allows the estimation unit 16 to be omitted from the condition monitoring system 1 of this embodiment. Nevertheless, the information about the number of revolutions, estimated by the estimation unit 16, of the mover 442 may also be used for any purpose other than having the analysis data generated by the generation unit 12. Thus, the condition monitoring system 1 of this embodiment may include the estimation unit 16 as well.

The configuration described for this second embodiment may also be adopted in combination with any of various configurations described for the first embodiment (and its variations) as appropriate.

(Resume)

As can be seen from the foregoing description, a condition monitoring system 1 according to a first aspect is a system for monitoring a condition concerning a converter 4 to convert energy of a mover 442 unidirectionally from kinetic energy to electric energy or from electric energy to kinetic energy, or bidirectionally between kinetic energy and electric energy. The mover 442 performs a periodic motion at a variable drive frequency fx. The condition monitoring system 1 includes an acquisition unit 11 and a generation unit 12. The acquisition unit 11 acquires waveform data from a measuring device 2 to measure an electrical signal that is either output or input of the converter 4. The waveform data represents a waveform of the electrical signal. The generation unit 12 generates, based on the waveform data, analysis data to monitor the condition concerning the converter 4. The generation unit 12 obtains, by frequency analysis, a plurality of combinations, each including a value of a frequency fy and a value of a feature quantity Sz that is either intensity Iz or phase, based on the waveform data when a value of the drive frequency fx varies and thereby generates the analysis data Da1 having at least three variables including the frequency fy, the feature quantity Sz, and the drive frequency fx.

According to this aspect, monitoring waveform data, representing the waveform of an electrical signal that is either the output or input of the converter 4, allows the condition concerning the converter 4 to be diagnosed based on any sign appearing in this waveform data. Thus, if the diagnosis made by the condition monitoring system 1 indicates that there should be some fault with a movable block 41, then the user may take some proactive measures such as maintenance (including checkup and repair) of the converter 4 before serious damage is done to the converter 4. That is to say, this condition monitoring system 1 reduces the chances of the damage spreading by detecting any early symptom of damage that could be done to the converter 4 and by taking appropriate precautions before serious damage is done to the converter 4. In other words, the condition monitoring system 1 predicting the damage that could be done to the converter 4 allows the user to do maintenance and management of the converter 4 as planned. This reduces the chances of the converter 4 becoming inoperative due to serious damage done to the converter 4, thus contributing to increasing the operating rate of the converter 4 as well.

In addition, this condition monitoring system 1 is also allowed to monitor the condition concerning the converter 4 even without detecting mechanical vibrations produced in the converter 4. That is to say, this condition monitoring system 1 is able to diagnose the condition concerning the converter 4 based on the waveform data representing the waveform of an electrical signal that is either the output or input of the converter 4. Therefore, in the condition monitoring system 1 according to this aspect, a sensor (first sensor 211) for measuring the electrical signal may be arranged on an electrical path on either the output side or input side of the converter 4 (armature-side electrical paths 541). Thus, unlike a situation where vibration sensors are used as in the known art, there is no need to install the measuring device 2 near the region where vibrations are produced. Consequently, this aspect facilitates introduction and installation of the condition monitoring system 1.

Furthermore, the analysis data Da1 for use to monitor the condition concerning the converter 4 has at least three variables including a frequency fy, a feature quantity Sz, and a drive frequency fx. Therefore, compared with monitoring the condition concerning the converter 4 using only the frequency fy and the feature quantity Sz with respect to a certain drive frequency fx, this improves the accuracy of monitoring the condition concerning the converter 4. The reason is that using only the frequency fy and the feature quantity Sz could result in an erroneous fault diagnosis about the converter 4, for example, when the feature quantity Sz (which may be an intensity Iz, for example) reaches a peak at a particular frequency fy with respect to a certain drive frequency fx due to the effect of some disturbance. In contrast, according to this aspect, a three-dimensional data set, including not only the frequency fy and the feature quantity Sz but also the drive frequency fx as variables, may be used to monitor the condition concerning the converter 4, thus improving the accuracy of monitoring the condition concerning the converter 4.

In a condition monitoring system 1 according to a second aspect, which may be implemented in conjunction with the first aspect, the generation unit 12 is configured to perform sort processing for rearranging the analysis data according to the drive frequency fx.

This aspect facilitates determining a specific interval Fi1 correlated to the drive frequency fx, and eventually facilitates determining a particular frequency f1-f4, thus improving the accuracy of motoring the condition concerning the converter 4.

In a condition monitoring system 1 according to a third aspect, which may be implemented in conjunction with the first or second aspect, the analysis data is configured to display an image Im1 in which a plurality of pixels, of which pixel values each represent the feature quantity Sz, are arranged two-dimensionally along axes of the frequency fy and the drive frequency fx.

This aspect allows a human user to diagnose the condition concerning the converter 4 more easily with his or her eyes by displaying the image Im1 on a display device, for example.

A condition monitoring system 1 according to a fourth aspect is a system for monitoring a condition concerning a converter 4 to convert energy of a mover 442 unidirectionally from kinetic energy to electric energy or from electric energy to kinetic energy, or bidirectionally between kinetic energy and electric energy. The mover 442 performs a periodic motion at a variable drive frequency fx. The condition monitoring system 1 includes a diagnosis unit 13. The diagnosis unit 13 diagnoses the condition concerning the converter 4 based on analysis data to be generated from waveform data representing a waveform of an electrical signal that is either output or input of the converter 4. The analysis data is generated by obtaining, by frequency analysis, a plurality of combinations, each including a value of a frequency fy and a value of a feature quantity Sz that is either intensity Iz or phase, based on the waveform data when a value of the drive frequency fx varies. The analysis data has at least three variables including the frequency fy, the feature quantity Sz, and the drive frequency fx.

According to this aspect, monitoring waveform data, representing the waveform of an electrical signal that is either the output or input of the converter 4, allows the condition concerning the converter 4 to be diagnosed based on any sign appearing in this waveform data. This condition monitoring system 1 is also allowed to monitor the condition concerning the converter 4 even without detecting mechanical vibrations produced in the converter 4. Consequently, this aspect facilitates introduction and installation of the condition monitoring system 1. Furthermore, the analysis data Da1 for use to monitor the condition concerning the converter 4 has at least three variables including a frequency fy, a feature quantity Sz, and a drive frequency fx. Therefore, compared with monitoring the condition concerning the converter 4 using only the frequency fy and the feature quantity Sz with respect to a certain drive frequency fx, this improves the accuracy of monitoring the condition concerning the converter 4. The reason is that using only the frequency fy and the feature quantity Sz could result in an erroneous fault diagnosis about the converter 4, for example, when the feature quantity Sz (which may be an intensity Iz, for example) reaches a peak at a particular frequency fy with respect to a certain drive frequency fx due to the effect of some disturbance. In contrast, according to this aspect, a three-dimensional data set, including not only the frequency fy and the feature quantity Sz but also the drive frequency fx as variables, may be used to monitor the condition concerning the converter 4, thus improving the accuracy of monitoring the condition concerning the converter 4.

In a condition monitoring system 1 according to a fifth aspect, which may be implemented in conjunction with the fourth aspect, the diagnosis unit 13 is configured to diagnose the condition concerning the converter 4 based on a value of the feature quantity Sz, corresponding to a value of a particular frequency f1-f4 among multiple values of the frequency fy, by reference to the analysis data.

This aspect allows the diagnosis unit 13 to diagnose the condition concerning the converter 4 more accurately.

In a condition monitoring system 1 according to a sixth aspect, which may be implemented in conjunction with the fifth aspect, the diagnosis unit 13 determines a coefficient n when a value of the feature quantity Sz, corresponding to multiple combinations, satisfies a predetermined condition, and thereby determine the particular frequency f1-f4 based on the value of the coefficient n thus determined. Each of the multiple combinations consists of a value of the drive frequency fx and a value of a frequency fy that are given by a predetermined relational expression using at least the drive frequency fx, the frequency fy, and the coefficient n.

This aspect allows the diagnosis of the condition concerning the converter 4 by the diagnosis unit 13 to be automated relatively easily.

In a condition monitoring system 1 according to a seventh aspect, which may be implemented in conjunction with the sixth aspect, the predetermined relational expression, further using a reference frequency fs1 of the electrical signal, is fy=fs1+n×fx.

This aspect allows the processing load on the diagnosis unit 13 in automatically diagnosing the condition concerning the converter 4 to be lightened.

In a condition monitoring system 1 according to an eighth aspect, which may be implemented in conjunction with any one of the first to seventh aspects, the mover 442 is configured to perform a rotary motion at the drive frequency fx.

This aspect makes the condition monitoring system 1 applicable to a converter 4 with a rotary mover 442 such as a wind turbine facility.

In a condition monitoring system 1 according to a ninth aspect, which may be implemented in conjunction with the eighth aspect, the mover 442 includes field windings 452, and the condition monitoring system 1 further includes an estimation unit 16 to obtain the value of the drive frequency fx using at least output of the field windings 452.

This aspect allows, even when the converter 4 is provided with no RPM monitor, the estimation unit 16 to estimate the drive frequency fx (RPM) value of the mover 442.

In a condition monitoring system 1 according to a tenth aspect, which may be implemented in conjunction with any one of the first to ninth aspects, the converter 4 constitutes a power generation facility.

This aspect makes the condition monitoring system 1 applicable to the converter 4 serving as a power generation facility such as a wind turbine facility. This allows the condition concerning the converter 4 to be monitored using waveform data representing the waveform of an electrical signal that is the output of the converter 4.

A condition monitoring method according to an eleventh aspect is a method for monitoring a condition concerning a converter 4 to convert energy of a mover 442 unidirectionally from kinetic energy to electric energy or from electric energy to kinetic energy, or bidirectionally between kinetic energy and electric energy. The mover 442 performs a periodic motion at a variable drive frequency fx. The condition monitoring method includes acquisition processing and generation processing. The acquisition processing includes acquiring waveform data from a measuring device 2 to measure an electrical signal that is either output or input of the converter 4. The waveform data represents a waveform of the electrical signal. The generation processing includes generating, based on the waveform data, analysis data to monitor the condition concerning the converter 4. The generation processing includes obtaining, by frequency analysis, a plurality of combinations, each including a value of a frequency fy and a value of a feature quantity Sz that is either intensity Iz or phase, based on the waveform data when a value of the drive frequency fx varies and thereby generating the analysis data having at least three variables including the frequency fy, the feature quantity Sz, and the drive frequency fx.

According to this aspect, monitoring waveform data, representing the waveform of an electrical signal that is either the output or input of the converter 4, allows the condition concerning the converter 4 to be diagnosed based on any sign appearing in this waveform data. This condition monitoring method also allows the condition concerning the converter 4 to be monitored even without detecting mechanical vibrations produced in the converter 4. Consequently, this aspect facilitates introduction of the condition monitoring method. Furthermore, the analysis data Da1 for use to monitor the condition concerning the converter 4 has at least three variables including a frequency fy, a feature quantity Sz, and a drive frequency fx. Therefore, compared with monitoring the condition concerning the converter 4 using only the frequency fy and the feature quantity Sz with respect to a certain drive frequency fx, this improves the accuracy of monitoring the condition concerning the converter 4.

A condition monitoring method according to a twelfth aspect is a method for monitoring a condition concerning a converter 4 to convert energy of a mover 442 unidirectionally from kinetic energy to electric energy or from electric energy to kinetic energy, or bidirectionally between kinetic energy and electric energy. The mover 442 performs a periodic motion at a variable drive frequency fx. The condition monitoring method includes diagnosis processing. The diagnosis processing includes diagnosing the condition concerning the converter 4 based on analysis data to be generated from waveform data representing a waveform of an electrical signal that is either output or input of the converter 4. The analysis data is generated by obtaining, by frequency analysis, a plurality of combinations, each including a value of a frequency fy and a value of a feature quantity Sz that is either intensity Iz or phase, based on the waveform data when a value of the drive frequency fx varies. The analysis data has at least three variables including the frequency fy, the feature quantity Sz, and the drive frequency fx.

According to this aspect, monitoring waveform data, representing the waveform of an electrical signal that is either the output or input of the converter 4, allows the condition concerning the converter 4 to be diagnosed based on any sign appearing in this waveform data. This condition monitoring method also allows the condition concerning the converter 4 to be monitored even without detecting mechanical vibrations produced in the converter 4. Consequently, this aspect facilitates introduction of the condition monitoring method. Furthermore, the analysis data Da1 for use to monitor the condition concerning the converter 4 has at least three variables including a frequency fy, a feature quantity Sz, and a drive frequency fx. Therefore, compared with monitoring the condition concerning the converter 4 using only the frequency fy and the feature quantity Sz with respect to a certain drive frequency fx, this improves the accuracy of monitoring the condition concerning the converter 4.

A condition monitoring program according to a thirteenth aspect is a program for monitoring a condition concerning a converter 4 to convert energy of a mover 442 unidirectionally from kinetic energy to electric energy or from electric energy to kinetic energy, or bidirectionally between kinetic energy and electric energy. The mover 442 performs a periodic motion at a variable drive frequency fx. The condition monitoring program makes a computer system execute acquisition processing and generation processing. The acquisition processing includes acquiring waveform data from a measuring device 2 to measure an electrical signal that is either output or input of the converter 4. The waveform data represents a waveform of the electrical signal. The generation processing includes generating, based on the waveform data, analysis data to monitor the condition concerning the converter 4. The generation processing includes obtaining, by frequency analysis, a plurality of combinations, each including a value of a frequency fy and a value of a feature quantity Sz that is either intensity Iz or phase, based on the waveform data when a value of the drive frequency fx varies and thereby generating the analysis data having at least three variables including the frequency fy, the feature quantity Sz, and the drive frequency fx.

According to this aspect, monitoring waveform data, representing the waveform of an electrical signal that is either the output or input of the converter 4, allows the condition concerning the converter 4 to be diagnosed based on any sign appearing in this waveform data. This condition monitoring program also allows the condition concerning the converter 4 to be monitored even without detecting mechanical vibrations produced in the converter 4. Consequently, this aspect facilitates introduction of the condition monitoring program. Furthermore, the analysis data Da1 for use to monitor the condition concerning the converter 4 has at least three variables including a frequency fy, a feature quantity Sz, and a drive frequency fx. Therefore, compared with monitoring the condition concerning the converter 4 using only the frequency fy and the feature quantity Sz with respect to a certain drive frequency fx, this improves the accuracy of monitoring the condition concerning the converter 4.

A condition monitoring program according to a fourteenth aspect is a program for monitoring a condition concerning a converter 4 to convert energy of a mover 442 unidirectionally from kinetic energy to electric energy or from electric energy to kinetic energy, or bidirectionally between kinetic energy and electric energy. The mover 442 performs a periodic motion at a variable drive frequency fx. The condition monitoring program makes a computer system execute diagnosis processing. The diagnosis processing includes diagnosing the condition concerning the converter 4 based on analysis data to be generated from waveform data representing a waveform of an electrical signal that is either output or input of the converter 4. The analysis data is generated by obtaining, by frequency analysis, a plurality of combinations, each including a value of a frequency fy and a value of a feature quantity Sz that is either intensity Iz or phase, based on the waveform data when a value of the drive frequency fx varies. The analysis data has at least three variables including the frequency fy, the feature quantity Sz, and the drive frequency fx.

According to this aspect, monitoring waveform data, representing the waveform of an electrical signal that is either the output or input of the converter 4, allows the condition concerning the converter 4 to be diagnosed based on any sign appearing in this waveform data. This condition monitoring program also allows the condition concerning the converter 4 to be monitored even without detecting mechanical vibrations produced in the converter 4. Consequently, this aspect facilitates introduction of the condition monitoring program. Furthermore, the analysis data Da1 for use to monitor the condition concerning the converter 4 has at least three variables including a frequency fy, a feature quantity Sz, and a drive frequency fx. Therefore, compared with monitoring the condition concerning the converter 4 using only the frequency fy and the feature quantity Sz with respect to a certain drive frequency fx, this improves the accuracy of monitoring the condition concerning the converter 4.

A storage medium according to a fifteenth aspect stores the analysis data generated by the condition monitoring method according to the eleventh aspect.

According to this aspect, monitoring waveform data, representing the waveform of an electrical signal that is either the output or input of the converter 4, allows the condition concerning the converter 4 to be diagnosed based on any sign appearing in this waveform data. This storage medium also allows the condition concerning the converter 4 to be monitored even without detecting mechanical vibrations produced in the converter 4. Consequently, this aspect facilitates introduction of the condition monitoring method.

Note that these aspects are only exemplary aspects of the present disclosure. Optionally, various configurations of the condition monitoring system 1 according to the first and second exemplary embodiments and their variations described above are also implementable as, for example, a condition monitoring method, a condition monitoring program, or a storage medium.

Note that the constituent elements according to the second, third, and fifth to tenth aspects are not essential elements of the condition monitoring system 1 but may be omitted as appropriate.

REFERENCE SIGNS LIST

1 Condition Monitoring System
11 Acquisition Unit
12 Generation Unit
13 Diagnosis unit
15 Storage Unit (Storage Medium)
16 Estimation Unit
2 Measuring Device 4 Converter
442 Mover
452 Field Winding
Da1 Analysis Data
fs1 Reference Frequency
f1-f4 Particular Frequency
fx Drive Frequency
fy Frequency
Iz Intensity
Im1 Image

The invention claimed is:

1. A condition monitoring system configured to monitor a condition concerning a converter, the converter being configured to convert energy of a mover unidirectionally from kinetic energy to electric energy or from electric energy to kinetic energy, or bidirectionally between kinetic energy and electric energy, the mover performing a periodic motion at a variable drive frequency, the condition monitoring system comprising:
   a measuring device configured to measure an electrical signal that is either output or input of the converter, wherein
      the converter includes either a power generator or a motor that includes a stator and the mover,
      the stator includes armature windings, and
      the measuring device includes a sensor electrically coupled to armature windings to detect a current flowing through the armature windings;
   an acquisition unit configured to acquire waveform data from the measuring device, the waveform data representing a waveform of the electrical signal;
   a generation unit configured to generate analysis data based on the waveform data, the analysis data being used to monitor the condition concerning the converter,
      the generation unit being configured to obtain, by frequency analysis, a plurality of combinations, each including a value of a frequency and a value of a feature quantity that is either intensity or phase, based on the waveform data when a value of the drive frequency varies and thereby generate the analysis data having at least three variables including the frequency, the feature quantity, and the drive frequency;
   a diagnosis unit configured to diagnose, based on the analysis data generated by the generation unit, the condition concerning the converter; and
   an output unit configured to output a result of the diagnosis made by the diagnosis unit, the result output by the output unit includes data representing at least the condition concerning the converter.

2. The condition monitoring system of claim 1, wherein the generation unit is configured to perform sort processing for rearranging the analysis data according to the drive frequency.

3. The condition monitoring system of claim 1, wherein the analysis data is configured to display an image in which a plurality of pixels, of which pixel values each represent the feature quantity, are arranged two-dimensionally along axes of the frequency and the drive frequency.

4. The condition monitoring system of claim 1, wherein the diagnosis unit is configured to diagnose the condition concerning the converter based on a value of the feature quantity, corresponding to a value of a particular frequency among multiple values of the frequency, by reference to the analysis data.

5. The condition monitoring system of claim 4, wherein the diagnosis unit is configured to determine a coefficient n when a value of the feature quantity, corresponding to multiple combinations, satisfies a predetermined condition, and thereby determine the particular frequency based on the value of the coefficient n thus determined, each of the multiple combinations including a value of the drive frequency and a value of the frequency that are given by a predetermined relational expression using at least the drive frequency fx, the frequency fy, and the coefficient n.

6. The condition monitoring system of claim 5, wherein the predetermined relational expression, further using a reference frequency fs1 of the electrical signal, is $fy = fs1 + n \times fx$.

7. The condition monitoring system of claim 1, wherein the mover is configured to perform a rotary motion at the drive frequency.

8. The condition monitoring system of claim 7, wherein the mover includes a field winding, and
   the condition monitoring system further includes an estimation unit configured to obtain the value of the drive frequency using at least output of the field winding.

9. The condition monitoring system of claim 1, wherein the converter constitutes a power generation facility.

10. A condition monitoring method for monitoring a condition concerning a converter, the converter being configured to convert energy of a mover unidirectionally from kinetic energy to electric energy or from electric energy to kinetic energy, or bidirectionally between kinetic energy and electric energy, the mover performing a periodic motion at a variable drive frequency, the condition monitoring method comprising:
   measuring, using a measuring device, an electrical signal that is either output or input of the converter, wherein
      the converter includes either a power generator or a motor that includes a stator and the mover,
      the stator includes armature windings,
      the measuring device includes a sensor electrically coupled to the armature windings to detect a current flowing through the armature windings;
   acquisition processing of acquiring waveform data from the measuring device, the waveform data representing a waveform of the electrical signal;
   generation processing of generating analysis data based on the waveform data, the analysis data being used to monitor the condition concerning the converter,
      the generation processing including obtaining, by frequency analysis, a plurality of combinations, each including a value of a frequency and a value of a feature quantity that is either intensity or phase, based on the waveform data when a value of the drive frequency varies and thereby generating the analysis data having at least three variables including the frequency, the feature quantity, and the drive frequency;
   diagnosing, based on the analysis data generated by the generation unit, the condition concerning the converter; and
   outputting a result of the diagnosis made by the diagnosis unit, the result output by the output unit includes data representing at least the condition concerning the converter.

* * * * *